(12) United States Patent
Goller

(10) Patent No.: US 10,541,610 B1
(45) Date of Patent: Jan. 21, 2020

(54) SPECTRAL SHAPING OF SPREAD SPECTRUM CLOCKS/FREQUENCIES THROUGH POST PROCESSING

(71) Applicant: TEXAS INSTRUMENTS INCORPORATED, Dallas, TX (US)

(72) Inventor: Joerg Erik Goller, Tiefenbach (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/107,742

(22) Filed: Aug. 21, 2018

(51) Int. Cl.
| | | |
|---|---|---|
| *H02M 3/157* | (2006.01) | |
| *H02M 3/156* | (2006.01) | |
| *G06F 7/58* | (2006.01) | |
| *G01R 31/3183* | (2006.01) | |
| *H02M 1/08* | (2006.01) | |

(52) U.S. Cl.
CPC .... *H02M 3/156* (2013.01); *G01R 31/318385* (2013.01); *G06F 7/584* (2013.01); *H02M 1/082* (2013.01); *H02M 3/157* (2013.01)

(58) Field of Classification Search
CPC ...... H02M 3/156; H02M 3/157; H02M 1/082; H02M 1/0845; H02M 3/33515; H02M 1/14; H02M 1/143; G01R 31/318385; G06F 7/584
USPC ................ 323/211, 241, 283, 322
See application file for complete search history.

(56) References Cited

U.S. PATENT DOCUMENTS

| | | | | |
|---|---|---|---|---|
| 5,802,187 A | * | 9/1998 | Hsu .................. | G10K 15/02 327/172 |
| 2010/0253305 A1 | * | 10/2010 | Melanson .......... | H02M 1/4225 323/282 |
| 2017/0099011 A1 | * | 4/2017 | Freeman ............ | H02M 7/06 |

OTHER PUBLICATIONS

Tao et al., "PWM Control Architecture With Constant Cycle Frequency Hopping and Phase Chopping for Spur-Free Operation in Buck Regulators," IEEE Transactions on Very Large Scale Integration (VLSI) Systems, vol. 21, No. 9, Sep. 2013, pp. 1596-1607.
Wikipedia, "Spread Spectrum," 5 p. [Online] https://en.wikipedia.org/wiki/Spread_spectrum#Spread-spectrum_clock_signal_generation.

* cited by examiner

*Primary Examiner* — Alex Torres-Rivera
(74) *Attorney, Agent, or Firm* — Tuenlap Chan; Charles A. Brill; Frank D. Cimino

(57) ABSTRACT

An integrated circuit. The integrated circuit comprises a timebase generator and a switch mode direct current-to-direct current (DC-to-DC) converter coupled to the timebase generator. The timebase generator comprises a linear feedback shift register (LFSR) having an output and a logic circuit comprising a first logic inverter, a first AND logic gate, and a first multiplexer, wherein the first logic inverter has an input coupled to a most significant bit of the output of the LFSR, wherein the first AND logic gate has a first input coupled to a second most significant bit of the output of the LFSR and a second input coupled to an output of the first logic inverter, wherein a selector input of the first multiplexer is coupled to an output of the first AND logic gate.

13 Claims, 13 Drawing Sheets

US 10,541,610 B1

SPECTRAL SHAPING OF SPREAD SPECTRUM CLOCKS/FREQUENCIES THROUGH POST PROCESSING

BACKGROUND

Direct current-to-direct current (DC-to-DC) converters find many applications in electronic devices. For example, DC-to-DC converters are used in mobile electronic devices to convert battery power to different voltage levels specified by different chips in the device—display drivers, camera peripherals, digital processors, field programmable gate arrays (FPGA), application specific integrated circuits (ASICs), interface devices, vibrator devices, and others. Some DC converters receive an input DC voltage and step it down to a lower DC voltage. Some DC converters receive an input DC voltage and step it up to a higher DC voltage. Some DC converters are configurable or controllable to both step up and step down DC voltage. In some cases, the operation of these DC-to-DC converters is based on switching circuit operation modes and hence these switch mode DC-to-DC converters rely on a timebase generator to control the switching frequency.

SUMMARY

In accordance with at least one example of the disclosure, an integrated circuit, comprises a time base generator and a switch mode direct current-to-direct current (DC-to-DC) converter coupled to the timebase generator. The timebase signal generator comprises a linear feedback shift register (LFSR) having an output and a logic circuit. The logic circuit comprises a first logic inverter, a first AND logic gate, and a first multiplexer, wherein the first logic inverter has an input coupled to a most significant bit of the output of the LFSR, wherein the first AND logic gate has a first input coupled to a second most significant bit of the output of the LFSR and a second input coupled to an output of the first logic inverter, wherein a selector input of the first multiplexer is coupled to an output of the first AND logic gate, a first input of the first multiplexer is coupled to the second most significant bit of the output of the LFSR, and a second input of the first multiplexer is coupled to a logic low source.

In accordance with at least one example of the disclosure, a system comprises an integrated circuit comprising a timebase generator and a switch mode direct current-to-direct current (DC-to-DC) converter coupled to the timebase generator and configured to output a DC power based on the timebase generated by the timebase generator. The timebase generator comprises a linear feedback shift register (LFSR) configured to output a timebase control word to spread a timebase frequency, a logic circuit having an input coupled to the LFSR and configured to modify selected values of the timebase control word, and a timebase signal generator coupled to the LFSR and to the logic circuit, wherein the timebase signal generator is configured to generate a timebase of the timebase generator based on the timebase control word received from the LFSR and from the logic circuit.

In accordance with at least one example of the disclosure, a method of operating a switch mode direct current to direct current (DC-to-DC) converter comprises outputting a timebase control word from a linear feedback shift register configured to produce a sequence of different timebase control word values, wherein the timebase control word comprises bits and receiving the timebase control word by a logic circuit. The method further comprises, based on a determination by the logic circuit that the timebase control word has a value in a center range of values, shifting the value of the timebase control word by the logic circuit, based on a determination by the logic circuit that the timebase control word has a value outside the center range of values, leaving the value of the timebase control word unchanged by the logic circuit, and outputting the timebase control word by the logic circuit. The method further comprises generating a timebase by a timebase signal generator based on the timebase control word output by the logic circuit and switching the switch mode DC-to-DC converter based on the timebase.

In accordance with at least one example of the disclosure, an integrated circuit comprises a timebase generator and a switch mode direct current-to-direct current (DC-to-DC) converter coupled to the timebase generator. The timebase generator comprises a linear feedback shift register (LFSR) configured to generate a pseudo-random sequence of timebase control word values, a spectral shaping post-processing component coupled to the LFSR and configured to adapt at least some of the timebase control word values, and a timebase signal generator coupled to the LFSR and to the spectral shaping post-processing component, wherein the timebase signal generator is configured to generate a timebase of the timebase generator based on the timebase control word received from the LFSR and from the spectral shaping post-processing component, wherein the adaptation of some of the timebase control word values by the spectral shaping post-processing component regulates the timebase signal generator to produce a predefined timebase spectrum.

In accordance with at least one example of the disclosure, an integrated circuit comprises a timebase generator and a switch mode direct current-to-direct current (DC-to-DC) converter. The timebase generator comprises a linear feedback shift register (LFSR) having an output, a logic circuit coupled to the output of the LFSR and having an output, and a timebase signal generator coupled to the output of the LFSR and the output of the logic circuit and having an output.

BRIEF DESCRIPTION OF THE DRAWINGS

For a detailed description of various examples, reference will now be made to the accompanying drawings in which.

DETAILED DESCRIPTION

Figure 1:
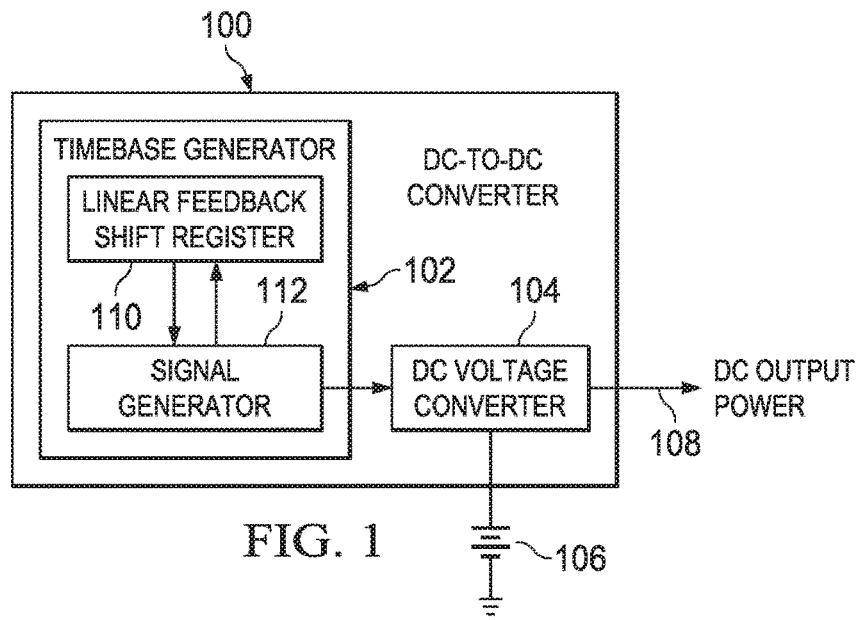
FIG. 1 shows a switch mode DC-to-DC converter integrated circuit in accordance with various examples.

Switch mode DC-to-DC converters rely on switching a circuit mode of operation, where the switching is inherent to producing an output DC voltage that is independent from the voltage level of the input DC voltage. In examples, this switching causes an undesirable noise spur at the switching frequency that can be detected at various points in the switch mode DC-to-DC converters—in the input voltage, in internal points within the converters, and at the output voltage. This noise spur interferes with electronic device and system performance, both performance within the switch mode DC-to-DC converter and performance of electronic devices receiving the DC voltage output by the switch mode DC-to-DC converter.

To solve the foregoing problem, the present disclosure teaches dithering or shifting the frequency of the switching in a pseudo-random pattern that spreads the switching noise across a range of frequencies, thereby lowering the amplitude of switching noise at any one frequency. In examples, a linear feedback shift register (LFSR) is used to generate a sequence of N-bit values that repeats continuously. In examples, a LFSR is used to generate a sequence of $2^{(N)}-1$ different N-bit values. Because in some examples the values produced by the LFSR are pseudo-randomly distributed and none of the values are repeated in a cycle of the LFSR, a modulation controlled by the above mentioned sequence of values generated by the LFSR does not introduce an additional low frequency noise source into the switch mode DC-to-DC converter. The output values of the LFSR drive a control that varies the switching frequency of the switch mode DC-to-DC converter in a narrow range of frequencies around a target switching frequency. To achieve design objectives of a switch mode DC-to-DC converter, an optimal or target switching frequency is defined, and switching at a frequency too far different (e.g., beyond a threshold) from that target switching frequency degrades performance of the switch mode DC-to-DC converter unacceptably. The framework for reducing switching noise described herein has application to reducing switching noise in clock generator chips as well, for example in environments where cycle-to-cycle jitter can be tolerated better than switching noise.

As an enhancement to this technique of reducing switching noise in a switch mode DC-to-DC converter, the output values of the LFSR are post-processed, for example mid-range values in the range of LFSR output values. In an example, the switching noise in the switch mode DC-to-DC converter is greatest in the mid-range of the switching frequencies produced by the system described above. By either increasing or decreasing the mid-range output values of the LFSR, this maximum switching noise is reduced. For example, a 7-bit LFSR outputs values in the range 1 to 127. LFSR output values from 32 to 63 are reduced by 32; LFSR output values from 64 to 95 are increased by 32; LFSR output values less than 32 and greater than 95 are left unchanged. In other examples, every other LFSR output value in the range from 32 to 63 is reduced by 32; every other LFSR output value in the range from 64 to 95 is increased by 32; and all other LFSR output values are left unchanged. Yet other schemes for altering or adapting mid-range LFSR values are contemplated by the present disclosure. For example, 3 of 4 mid-range LFSR values are changed. For example, 1 of 4 mid-range LFSR values are changed.

Altering the output values of the LFSR (e.g., the timebase control word values) in this way is referred to as spectral shaping in some contexts herein, for example, spectral shaping of the accumulated switching noise. In an example, post-processing the output values of the LFSR to alter at least some of the mid-range output values of the LFSR (e.g., altering at least some of the mid-range values of the timebase control word) results in some values in the N-bit output of the LFSR being repeated during a single cycle of the sequence of values of the LFSR. While altering some of the mid-range values of the output of the LFSR is an example described above and in more detail hereinafter, other spectral shaping regimes are contemplated.

FIG. 1 depicts an illustrative switch mode DC-to-DC converter integrated circuit (IC) 100. In examples, the switch mode DC-to-DC converter IC 100 comprises a timebase generator 102. The timebase generator 102 generates a switching signal or timebase that is used by the switch mode DC-to-DC converter IC 100 to switch to perform its conversion function. As used herein, a timebase signal refers to an electric signal that contains patterns or events. In an example, the timebase signal is a signal that contains events constituted by a rising edge of a pulse. In an example, the timebase signal is a signal that contains events constituted by a falling edge of a pulse. In an example, the timebase signal is a signal that contains events constituted by the peak value of a triangular wave signal or a saw tooth wave signal. In an example, the timebase signal is a signal that contains events constituted by a minimum value of a triangular wave signal or of a saw tooth wave signal. In an example, the timebase signal is a pulse width. In other examples, the timebase signal is a signal that contains events constituted by other patterns.

The timebase generator 102 comprises a linear feedback shift register (LFSR) 110 and a signal generator 112. The LFSR 110 and the signal generator 112 are communicatively coupled to each other. The signal generator 112 provides a clock signal to the LFSR 110 that causes it to shift bits serially through its registers. In examples, the signal generator 112 also provides a switching signal from the timebase generator 102 for use by the switch mode DC-to-DC converter IC 100. The digital value stored by the LFSR 110 is output to the signal generator 112 and causes the switching signal output by the signal generator 112 to vary in switching frequency. The signal generator 112 also provides its output to the DC voltage converter 104, which, in turn, outputs a DC-converted output power signal 108 and couples to ground 106. In some contexts, the signal generator 112 is referred to as a timebase signal generator.

In an example, the LFSR 110 is a Fibonacci type of LFSR. In an example, the LFSR 110 is a Galois type of LFSR. In an example, the LFSR 110 is replaced with another component that generates a multi-bit sequence of pseudo-random numbers. Some of the output values of registers of the LFSR 110 are provided to the inputs of one or more logic gates (not shown in FIG. 1) to generate an input signal to an initial register of the LFSR 110. Because the LFSR 110 is clocked (e.g., the bit shifting within the LFSR 110 is controlled) by the output of the signal generator 112, the LFSR 110 and the signal generator 112 remain in synchronization. Said in other words, generation of a next pseudo-random pattern or value of the LFSR 110 (e.g., changing switching signal frequency) is based on the last clock edge that was generated.

Figure 2A:
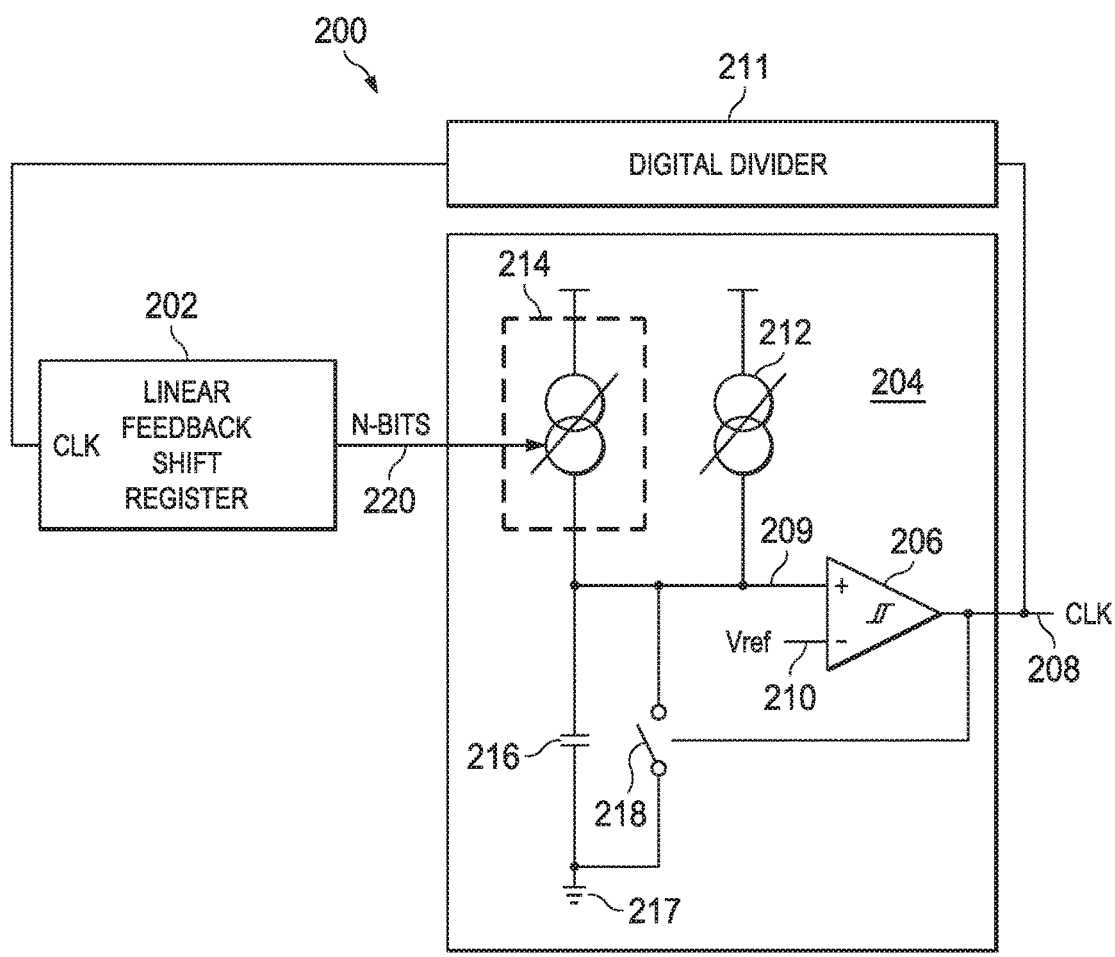
FIG. 2A shows a timebase generator in accordance with various examples.

FIG. 2A shows an illustrative timebase generator 200. In an example, the timebase generator 200 is used to implement the timebase generator 102 described above with reference to FIG. 1. In example, the timebase generator 200 is used to implement a clock generator. In an example, the timebase generator 200 comprises a LFSR 202 and a signal generator 204. In an example, the LFSR 202 is a Fibonacci LFSR. In another example, the LFSR 202 is a Galois LFSR.

In an example, the signal generator 204 comprises a comparator 206 that outputs a high logic level as a clock signal 208 and/or timebase when a voltage on a first input 209 exceeds the voltage of a voltage reference coupled to a second input 210. The timebase is used by the switch mode DC-to-DC converter IC 100 to switch. In some contexts, the signal generator 204 is referred to as a timebase signal generator.

In examples, the signal generator 204 further comprises a constant current source 212 and a varying current source 214, a capacitor 216, and a switch 218 (e.g., a transistor). A current output of the constant current source 212 and a current output of the varying current source 214 are coupled to a first lead of the capacitor 216. A second lead of the capacitor 216 is coupled to ground. The first lead of the capacitor 216 is also coupled to the first input 209 of the comparator 206. The output of the comparator 206 (e.g., clock signal 208) is coupled to a control lead of the switch 218. A first lead of the switch 218 is coupled to the first lead of the capacitor 216 and a second lead of the switch 218 is coupled to ground. When the switch 218 is closed, the first lead of the switch is connected to the second lead of the switch, and the first lead of the capacitor 216 is hence coupled to ground. When the switch 218 is open, the first lead of the switch is disconnected from the second lead of the switch 218. In an example, the output of the signal generator 204 is a clock pulse. The LFSR 202 is coupled to the comparator 206, for example coupled via the constant current source 212 and the varying current source 214.

In an example, this clock signal 208 output by the signal generator 204 is fed back to a clock input of the LFSR 202 which controls when the LFSR 202 shifts and outputs a different n-bit pseudo-random number at 220. In an example, the output 208 of the signal generator 204 is coupled to the input of a digital divider 211, and the output of the digital divider 211 is coupled to the clock input of the LFSR 202. The digital divider 211 divides the output 208 of the signal generator 204 by an integer. In an example, the digital divider 211 divides the output 208 of the signal generator 204 by an integer multiple of 2. Thus, the digital divider 211 divides the output 208 by one of 2, 4, 8, 16, 32, . . . , $2^k$ where k is a positive integer value. In examples, the digital divider 211 divides the output 208 by one of 3, 5, 6, 7, 9, 10, or another integer value. The digital divider 211, in an example, further contributes to decreasing switching noise in the switch mode DC-to-DC converter 100. In some examples, the timebase generator 200 does not comprise the digital divider 211 (e.g., the digital divider 211 is an optional component of the timebase generator 200), and the output 208 of the signal generator 204 is coupled to the clock input of the LFSR 202 without passing through a digital divider. The optional digital divider 211 has the effect of causing the signal generator 204 to maintain the same switching frequency for multiple cycles rather than changing on each cycle of the timebase.

The voltage at the first lead of the capacitor 216 and hence the voltage of the first input 209 ramps up as current produced by the constant current source 212 and varying current from the varying current source 214 is collected by the capacitor 216 (e.g., charging the capacitor 216). Said in other words, the capacitor 216 in effect sums the current output by the constant current source 212 and the varying current source 214 to produce a voltage value. When the voltage at the first input 209 exceeds the voltage of the voltage reference present at the second input 210 of the comparator 206, the comparator 206 outputs a logic high value on the clock signal 208. When the clock signal 208 is high, this causes the switch 218 to close and rapidly discharge the capacitor 216 to ground. As a result of discharging, the voltage at the first lead of the capacitor drops and hence the voltage at the first input 209 drops below the voltage reference coupled to the second input 210, and the output of the comparator 206 outputs a low logic level. The low logic level causes the switch 218 to open again, and allows the capacitor 216 to resume charging from constant current source 212 and varying current source 214.

If the varying current source 214 were not in the signal generator 204 or if it were turned off, the current charging the capacitor 216 would be constant, and the frequency of the clock signal 208 (and switching signal) would be a constant frequency. The output 220 of the registers of the LFSR 202 comprises an N-bit number that controls the varying current source 214 to produce more or less current as the N-bit number is larger or smaller. In some contexts, the output 220 of the registers of the LFSR 202 is referred to as an N-bit timebase control word. In an example, the output 220 of the registers of the LFSR 202 modifies a timebase signal generated by the signal generator 204 in a binary weighted manner.

Figure 2B:
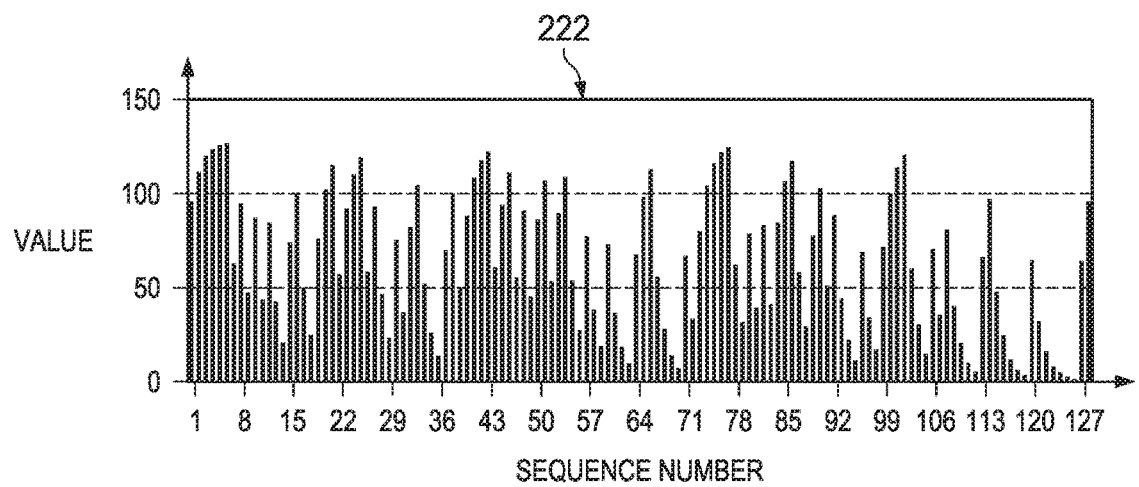
FIG. 2B shows a sequence of pseudo-random numbers generated by a linear feedback shift register (LFSR) in accordance with various examples.

In an example, the LFSR 202 comprises 7 registers and hence outputs a 7-bit number to the varying current source 214 from b0000001 to b1111111 (in this example b0000000 is an excluded value, as well as in other examples). In an example, the sequence of pseudo-random numbers produced by the LFSR 202 is represented in graph 222 as shown in FIG. 2B. If a different initial seed value for the LFSR 202 were used, the sequence of pseudo-random numbers would start at a different point in the sequence. The LFSR 202 starts with an initial seed value at sequence step 1, it produces a different value at sequence step 2, it produces a different value at sequence step 3, and so on through different values between 1 and 127 through the remaining sequence steps to step 127. After sequence step number 127, the LFSR 202 again produces the initial seed value at sequence step 128. The numbers generated by the LFSR 202 are said to be pseudo-random because they are not truly random but deterministic based on the configuration of the LFSR 202 (e.g., how the inputs to the registers of the LFSR 202 are generated). The numbers generated by the LFSR 202 are also said to be pseudo-random because their values are generally randomly distributed between 1 and 127. In other examples, a different circuit or circuit component is used instead of the LFSR 202 to generate a sequence of pseudo-random values for use in creating an N-bit timebase control word.

It is the nature of the configuration of the illustrative LFSR 202 that the 7-bit numbers output by its registers occur in a pseudo-random sequence, and that this sequence does not repeat any values until all 127 permitted values have been produced (although in some examples, it is possible for the sequence to include some repeated values). In an example this is referred to as a maximum length sequence of output values for the LFSR 202. Different LFSRs have different maximum length sequences associated with the number of registers the LFSR contains. For example, a maximum length sequence of a 9-bit Fibonacci LFSR is 511, and a maximum length sequence of an 11-bit Fibonacci LFSR is 2047. Not all LFSRs are maximum length LFSRs. In an example, the sequence length of an LFSR depends on a feedback path of the LFSR.

FIG. 2B shows a sequence of pseudo-random numbers produced by the LFSR 202. A pseudo-random number is associated to each sequence number (e.g., the sequence of integers 1, 2, 3, . . . , $2^N-1$). The pseudo-random number is not a linear function of its associated sequence number. The pseudo-random numbers are substantially randomly distributed over the sequence.

Figure 2C:
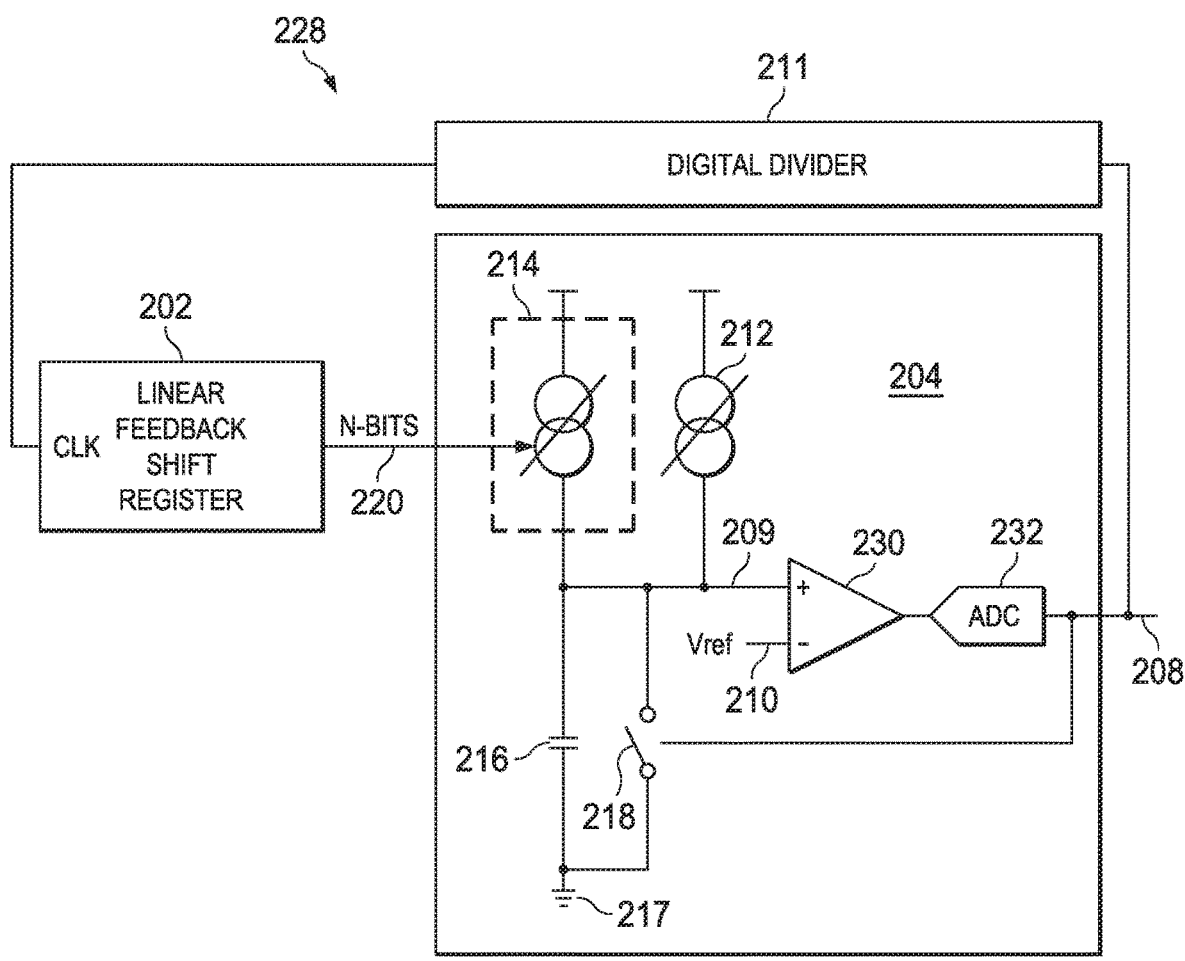
FIG. 2C shows another timebase generator in accordance with various examples.

FIG. 2C shows another illustrative timebase generator 228 that is an alternative example to the timebase generator 200 described above with reference to FIG. 2A. The timebase generator 228 is substantially similar to the timebase generator 200 described above, with the difference that the clock signal 208 is produced by the combination of a differential amplifier 230 and an analog-to-digital converter (ADC) 232. The differential amplifier 230 is coupled to the first lead of the capacitor 216 on its first input 209 and is coupled to a reference voltage source at its second input 210. The differential amplifier 230 outputs an analog signal that is based on its first and second inputs to the ADC 232, and the ADC 232 produces the clock signal 208 that feeds back into the LFSR 202 (possibly via digital divider 211) and to the switch 218.

In examples, the implementation of the timebase generators 102, 200, 228 described herein provides one or more benefits. In examples, timebase generators 102, 200, 228 occupy a small area on an integrated circuit. In examples, the implementation of the timebase generators 102, 200, 228 is applicable to a wide variety of circuit designs. In examples, the implementation of the timebase generator 102, 200, 228 promotes starting and stopping without disrupting a system relying on the switching signal it outputs. In examples, the implementation of the timebase generator 102, 200, 228 consumes little power.

The signal generator 204 can take many forms that are different from the examples described above with reference to FIG. 2A and FIG. 2C. In an example, a different signal generator generates a pulse-width timebase. In an example, a signal generator generates a minimum ON-time type of timebase or a minimum OFF-time type of timebase. In an example, the signal generator 204 converts the timebase control word to a timebase signal in a different way, using different circuitry from the constant current source 212 and the varying current source 214. In an example, the timebase control word is processed by digital logic to generate the timebase signal in the digital domain. In an example, a different analog process is used to transform the timebase control word to generate the timebase signal. The disclosure contemplates a broad variety of mechanisms for receiving a timebase control word in the form of a pseudo-random number and transforming this pseudo-random number into a timebase signal.

Figure 3:
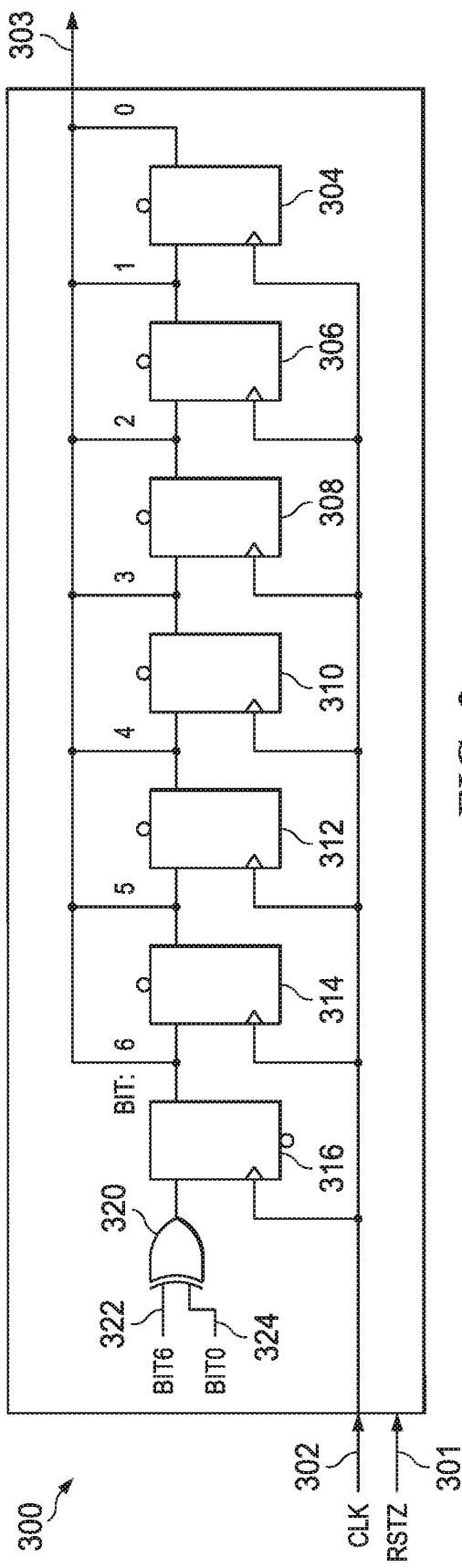
FIG. 3 shows a Fibonacci linear feedback shift register (LFSR) in accordance with various examples.

FIG. 3 shows an illustrative 7-bit Fibonacci LFSR 300. In an example, the LFSR 300 is, or is part of, the LFSR 110 of FIG. 1. In an example, the LFSR 300 is, or is part of, the LFSR 202 of FIG. 2A. In an example, the LFSR 300 is, or is part of, the LFSR 202 of FIG. 2C. In an example, the LFSR 300 comprises a reset zero input 301, a clock input 302, a 7-bit parallel output 303, a first register 304, a second register 306, a third register 308, a fourth register 310, a fifth register 312, a sixth register 314, and a seventh register 316. In an example, each of the registers 304-316 is a flip-flop. The output of the seventh register 316 is connected to the input of the sixth register 314. The output of the sixth register 314 is connected to the input of the fifth register 312. The output of the fifth register 312 is connected to the input of the fourth register 310. The output of the fourth register 310 is connected to the input of the third register 308. The output of the third register 308 is connected to the input of the second register 306. The output of the second register 306 is connected to the input of the first register 304. The output 324 of the first register 304 and the output 322 of the seventh register 316 are processed in an exclusive or operation (XORed) by an XOR gate 320 (connections to the XOR gate 320 are omitted from FIG. 3 for clarity) to determine the input to the seventh register 316.

The LFSR 300 is configured to be loaded with an initial seed value on power up of the device or if a reset is performed. In some examples, the seed value is any 7 bit value, excluding b0000000. While not illustrated as coupled to the registers 304-316 in FIG. 3 to avoid cluttering the figure, in an example the reset zero input 301 is coupled to a set or a reset input of the registers 304-316. As illustrated in FIG. 3, the seventh register 316 is configured to set its Q output to logic high when the reset zero input 301 is set to logic low and the first through sixth registers 304-314 are configured to set their Q outputs to logic low when the reset zero input 301 is set to logic low. Thus, the illustrative 7-bit Fibonacci LFSR 300 of FIG. 3 is depicted as configured to initialize with a seed value of b1000000. In other examples, the 7-bit Fibonacci LFSR 300 is configured to initialize with a different seed value different from b1000000 and different from b0000000.

Figure 4:
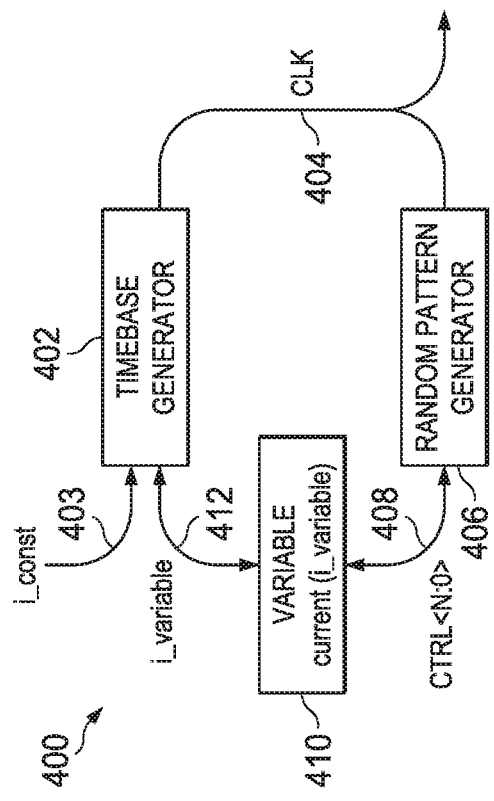
FIG. 4 shows a timebase generator processing method in accordance with various examples.

FIG. 4 is a flowchart of an illustrative process 400 of generating the clock output or the switching signal of the timebase generator 200 of FIG. 2A or of timebase generator 102 of FIG. 1. The process 400 continuously repeats while operating the timebase generator 102, 200 and while operating the switch mode DC-to-DC converter 100. At block 402, a timebase generator determines a clock period as a function of a constant current 403 and of a variable current 412, such as those produced by current sources 212, 214 in FIG. 2A. This clock period controls a clock 404 that has a frequency equal to the reciprocal of the period determined at block 402. The clock period is changing on each cycle through the loop of the process 400. In an example, the clock switches from low to high and back to low only one time during each cycle through the loop of the process 400.

The clock 404 controls a random pattern generator at block 406 to set a control value 408 to a newly calculated control value. In an example, the random pattern generator is a LFSR, such as those described above. In an example, the random pattern generator is a Fibonacci LFSR. In an example, the random pattern generator is one of a 7-bit Fibonacci LFSR, a 9-bit Fibonacci LFSR, an 11-bit Fibonacci LFSR, a 15-bit Fibonacci LFSR, or a 17-bit Fibonacci LFSR. In an example, the random pattern generator is a Galois LFSR. In some examples, the LFSR is configured to generate a maximum length sequence of pseudo-random values, none of which repeats during the maximum length cycle. At the end of the sequence of values, the sequence starts a new cycle, starting from the initial value of the sequence. Any initial seed value can be established for the LFSR, excepting a 0 value (b00 . . . 0). In another example, the random pattern generator is a different component or circuit from the LFSR, for example a different digital pseudo-random number generator component.

The control value 408 controls the variable current 412, where, in at least some examples, the amplitude of the variable current is a linear function of the control value 408. As the clock 404 pulses high and back low, the LFSR shifts values through its registers and sets a different value, and the different value establishes a different variable current, and the different variable current changes the clock period in the next cycle through the loop of the process 400. In an example, the output of the LFSR changes a pulsewidth of the next generated timebase signal.

Figure 5:
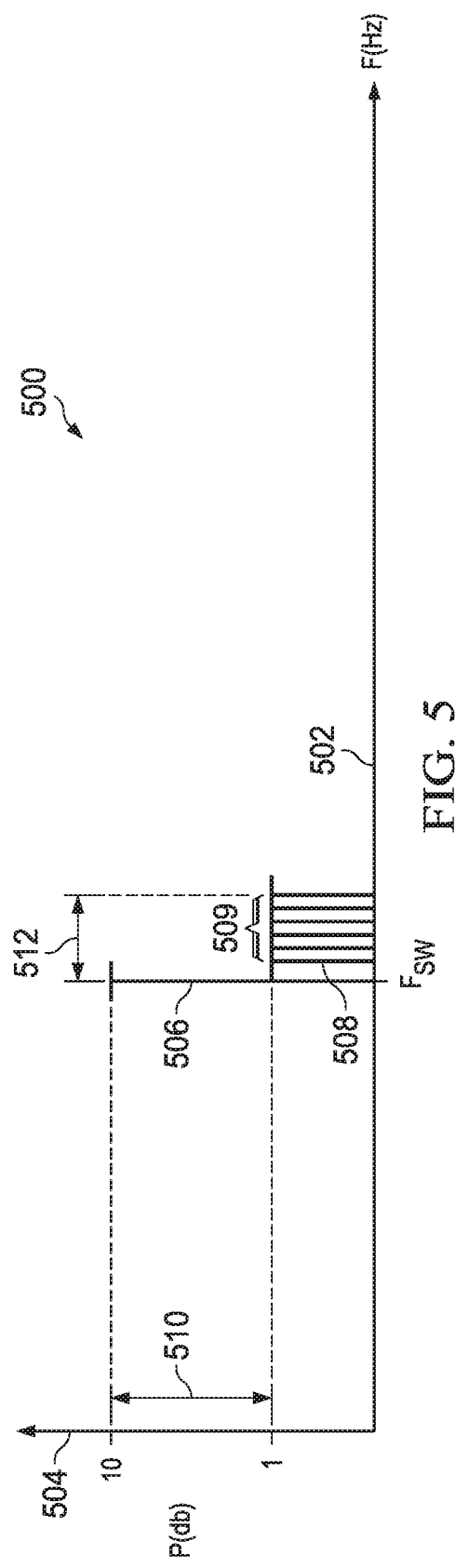
FIG. 5 shows a comparison between switching noise using a constant switching frequency and switching noise using a varying switching frequency in accordance with various examples.

FIG. 5 compares illustrative switching noise associated with a constant frequency switching signal versus switching noise associated with a varying frequency switching signal. An illustrative graph 500 comprises an X-axis 502 that represents frequency and a Y-axis 504 that represents power in a log base 10 scale. A first trace 506 represents the switching noise in a conventional switch mode DC-to-DC converter at the switching frequency Fsw. A second trace 508 is an example trace of multiple traces 509 that result from spreading the switching signal to multiple different frequencies as described herein. While only a few traces of the varying frequency switching noise are illustrated in FIG. 5, in some examples the number of the plurality of traces 509 equals the number of different values output by the LFSR in the timebase generator 102, 200.

While not illustrated as such in FIG. 5, the energy associated with the switching noise in a conventional switch mode DC-to-DC converter is not generated at a single frequency (e.g., trace 506) but is a narrowly distributed noise centered on the switching frequency and having a cone shaped distribution (e.g., when switching noise amplitude is represented in the frequency domain by a graph or trace), with a high value sharply sloping downward in amplitude to the lower frequency side and to the higher frequency side of the nominal switching frequency. This is because the frequency of switching in the conventional switch mode DC-to-DC converter is not perfectly timed but is subject to slight frequency variation. Likewise, the noise energies associated with the second trace 508 and the multiple traces 509 are not generated at a single frequency but are narrowly distributed noise centered on the multiple switching frequencies and having cone shaped distributions. This cone shape of switching noise is not represented in FIG. 5 in order to simplify the illustration and discussion. However, in the case of the traces 509, the low noise energy shoulders of the traces 509 overlap in the center of the switching frequency range and increase the cumulative noise in the mid-range of the switching frequencies versus the noise near the low-range and near the high-range of the switching frequencies. The present disclosure teaches systems and methods of reducing this mid-range noise due to overlapping shoulders of switching frequencies in the mid-range of switching frequencies, as discussed in further detail below.

In examples, the multiple traces 509 comprise 127 traces, 511 traces, 2047 traces, 32767 traces, 131071 traces, or some other number of traces. The second trace 508 represents the switching noise in the switch mode DC-to-DC converter 100 described above at a single frequency among multiple switching frequencies. The difference in power between the switching noise in a conventional switch mode DC-to-DC converter (first trace 506) and the switching noise in traces 509 when spreading the switching signal frequencies is illustrated as difference 510 (Y-axis is log base 10 scale). The spread of switching signal frequencies is illustrated as the spread switching signal frequency bandwidth 512.

While only a few traces of the varying frequency switching noise are illustrated in FIG. 5, in some examples the number of traces equals the number of different values output by the LFSR in the timebase generator 102, 200. For example, when using a 7-bit Fibonacci LFSR, as illustrated in FIG. 3, 127 traces would be present. Because the sum of the noise energy in the frequency spread of all the 127 traces would be approximately equal to the amplitude of the first trace 506, the noise energy of each of the 127 traces would be diminished. (The scale of the Y-axis 504 is log base 10 scale for clarity.) In a theoretical maximum, the energy in the frequency spread switching signal would be 1/127 or −21 dB (e.g., (10 log(1/127))=−21 dB) relative to the energy of the noise in the non-spread noise spur. In practice, less than the theoretical maximum energy attenuation would be expected.

In an example, the distance between the traces 509 and hence the total variation of the frequency of the switching signal is determined, at least in part, by the range of varying current output by the varying current source 214 in response to the output of the LFSR 202. The greater the maximum output of the varying current source 214, the wider the variation of frequency of the switching signal. In an example, the frequency varies less than 10% of a target switching frequency. In an example, the target frequency is the frequency of an unmodulated time base generator. For example, if the target frequency is 3 MHz, the switching signal ranges over a frequency bandwidth of less than 10% of 3 MHz or less than 300 kHz. For example, the switching frequency varies from 2.7 MHz to 3 MHz, from 2.85 MHz to 3.15 MHz, from 3 MHz to 3.3 MHz, or over smaller bandwidths. In an example, if the switching signal is varied over a greater range than 15%, the performance of the switch mode DC-to-DC converter 100 is degraded. In an example, if the switching signal is varied over a greater range than 10%, the performance of the switch mode DC-to-DC converter 100 is degraded. In an example, if the switching signal is varied over a greater range than 8%, the performance of the switch mode DC-to-DC converter 100 is degraded. In an example, if the switching signal is varied over a greater range than 6%, the performance of the switch mode DC-to-DC converter 100 is degraded.

Figure 6:
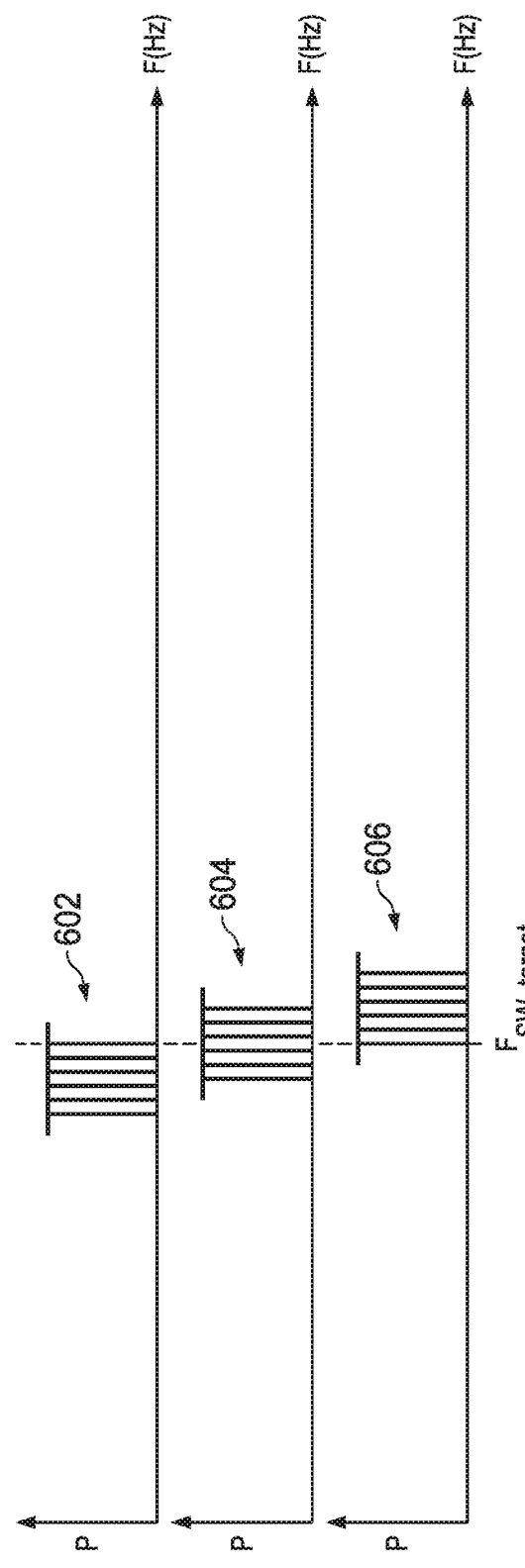
FIG. 6 shows adaptations of varying switching frequency in accordance with various examples.

FIG. 6 shows the frequency bandwidth of the switching signal varying from a minimum frequency to a maximum frequency, where the maximum frequency in the first multiple traces 602 is the target switching frequency. In a second multiple traces 604 the switching signal varies from a minimum frequency to a maximum frequency, where the target switching frequency is in about the middle of the varying switching signal frequency bandwidth. In a third multiple traces 606, the switching signal varies from a minimum frequency that is the target switching frequency to a maximum frequency.

The different multiple traces 602, 604, 606 can be established by varying the fixed current output of the constant current source 212 in FIG. 2A. In the first multiple traces 602, the constant current source is set to the level of the lowest frequency. In the third plurality of traces 606, the constant current source is set to the level associated with the target switching frequency. In the second multiple traces 604, the constant current source is set to a level between the levels of the first multiple traces 602 and the third multiple traces 606. The structure of the timebase generator 200 is flexible and can be adapted by designers to achieve different switching frequencies and different switching frequency bandwidths (the range of variation of switching signal frequency).

Referring to FIG. 2A and FIG. 2C, in an example, the varying current source 214 is implemented by multiple separate varying current source components, where each separate varying current source component is switched on or off by one of the output bits of the N-bit LFSR 202. The number of varying current source components is equal to the number N of the N-bit LFSR 202.

In an example, the constant current source 212 is configured to output 10 µA (microamps), a first component of the varying current source is configured to output 6.3 nA (nanoamps), a second component of the varying current source 214 is configured to output 12.6 nA, a third component of the varying current source 214 is configured to output 25.2 nA, a fourth component of the varying current source is configured to output 50.4 nA, a fifth component of the varying current source 214 is configured to output 100.8 mA, a sixth component of the varying current source 214 is configured to output 201.6 nA, and a seventh component of the varying current source 214 is configured to output 403.2 nA. Each of the components of the varying current source 214 turns on and off based on a corresponding bit in the output of the LFSR 202. When none of the component current sources of the varying current source 214 is turned on, the output of the varying current source 214 is zero, the capacitor 216 is charged only by the constant current source 212, the period of the clock 208 is longer, and the frequency of the switching signal is lower. When all of the component current sources of the varying current source 214 are switched on (e.g., the LFSR 202 outputs the value b1111111=127), the capacitor 216 is charged by about 10 µA current from the constant current source 212 and by about 800 nA current from the varying current source 214, the period of the clock 208 is shorter, and the frequency of the switching signal is higher. In different examples, different amounts of current are sourced by the constant current source 212 and by the component current sources of the varying current source 214.

Figure 7A:
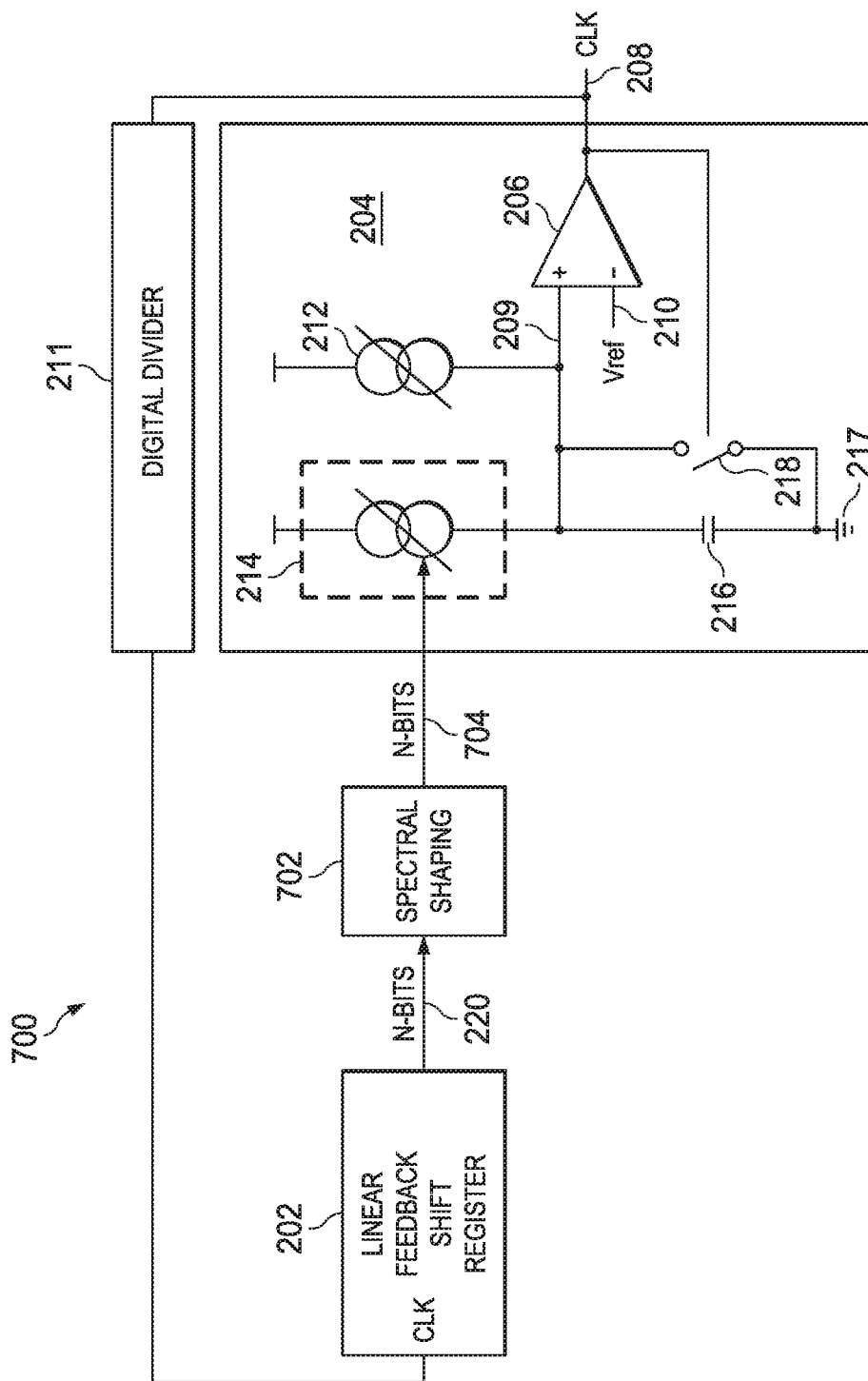
FIG. 7A shows a timebase generator including a spectral shaping component in accordance with various examples.

FIG. 7A shows a timebase generator 700 including a spectral shaping component 702. An N-bit timebase control word 704 is input to the signal generator 204 and controls the timebase signal 208 generated by the signal generator 204. In an example, the timebase generator 700 comprises a LFSR 202, a signal generator 204, and an optional digital divider 211. The LFSR 202, the signal generator 204, and the optional digital divider 211 are implemented and operate as described above. In an example, the signal generator 204 may be implemented without using the constant current source 212 and the varying current source 214, for example based on digital processing of the timebase control word 704 or based on a different analog process. In an example, the timebase generator 700 comprises a different source of pseudo-random values from the LFSR 202.

The spectral shaping component 702 performs post-processing on at least a portion of the N-bit output 220 of the LFSR 202, for example on the N−1 bit of the N-bit output of the LFSR 202, to spectrally shape the switching noise associated with the switching frequency of the switch mode DC-to-DC converter 100. In an example, bits 1 through N−2 and bit N output by the LFSR 202 are passed on unchanged to the N-bit timebase control word 704 (e.g., the outputs of bits 1 through N−2 and bit N are associated with the corresponding bit positions in the N-bit timebase control word 704) while bit N−1 of the N-bit timebase control word 704 is generated by the spectral shaping component 702. In some cases, the value of bit N−1 of the N-bit timebase control word 704 is unchanged from the N−1 bit output by the LFSR 202; in other cases the value of bit N−1 of the N-bit timebase control word 704 is inverted relative to the N−1 bit output by the LFSR 202. If the N−1 bit output by the LFSR 202 is a low logic value, inverting the N−1 bit entails increasing the value of the N-bit timebase control word 704 relative to the N-bit output of the LFSR 202. If the N−1 bit output by the LFSR 202 is a high logic value, inverting the N−1 bit entails decreasing the value of the N-bit timebase control word 704 relative to the N-bit output of the LFSR 202. In an example, the spectral shaping component 702 can perform different shaping of the control word than those examples described herein.

In an example, the spectral shaping component 702 regulates the signal generator 204 to produce a predefined timebase spectrum (e.g., a predefined range of switching frequencies or timebase frequencies). In an example, the predefined timebase spectrum may be a timebase spectrum that is depleted of some or all mid-range values of the timebase frequency range. This example is described more fully below. The teachings of the present disclosure, however, contemplate a wide variety of alternative predefined timebase spectra that the spectral shaping component 702 can regulate the signal generator 204 to achieve. In an example, the spectral shaping component 702 regulates the signal generator 204 to produce a timebase spectrum that is depleted of low-range values of the timebase frequency range. In an example, the spectral shaping component 702 regulates the signal generator 204 to produce a timebase spectrum that is depleted of low-range values and that is supplemented in high-range values of the timebase frequency range, for example by shifting some low-range values of the timebase control word to high-range values of the timebase control word.

In an example, inverting the N−1 bit as described herein causes some values in the sequence of $2^n-1$ different values output by the LFSR 202 to be repeated in the timebase control word 704 during one cycle of the LFSR 202. For example, based on a 7 bit LFSR 202, 40 (decimal) is 0101000 (binary). Inverting the N−1 bit converts this to 0001000 (binary), which is 8 (decimal). This implies that the timebase control word 704 value 8 (decimal) would be input twice to the signal generator 204 in one cycle of the LFSR 202. Performing this logic inversion selectively on N-bit values output by the LFSR 202 in the middle range of values of the N-bit output of the LFSR 202 in generating the N-bit timebase control word 704 reduces the accumulated switching noise in the middle of the range of switching frequencies, by redistributing some of that switching noise to a different place in the range of timebase frequencies or switching frequencies, for example at the lower portion or at the higher portion of the timebase frequency range. In some contexts, this reduction of the accumulated switching noise in the middle of the range of switching frequencies is referred to as spectral shaping.

In an example, the spectral shaping component 702 alters mid-range values output by the LFSR 202 to exclude the switching frequencies in the middle of the range of switching frequencies. In examples, this exclusion of switching frequencies in the middle of the range of switching frequencies lowers the switching noise maximum. Without the spectral shaping performed by the spectral shaping component 702, the switching noise exhibits a maximum in the middle of the range of switching frequencies that is greater than the switching noise maximum in the middle of the range of switching frequencies when using spectral shaping performed by the spectral shaping component 702. In other examples the spectral shaping component 702 can adapt control word values in different ways other than excluding all or some of the switching frequencies in the middle of the range of switching frequencies.

In an example, the LFSR 202 outputs 7-bit values in the range 1 to 127. LFSR 202 output values from 1 to 31 are sent to the signal generator 204 unchanged by the spectral shaping component 702 (e.g., the N-bit timebase control word 704 is identical to the N-bit output of the LFSR 202), LFSR 202 output values from 32 to 63 are reduced by a value of 32 by the spectral shaping component 702 and these decreased values are sent to the signal generator 204 (e.g., the N-bit timebase control word 704 is identical to the N-bit output of the LFSR 202 except that the N−1 value of the output of the LFSR 202 has been changed from a '1' to a '0'), LFSR 202 output values from 64 to 95 are increased by a value of 32 by the spectral shaping component 702 and these increased values are sent to the signal generator 204 (e.g., the N-bit timebase control word 704 is identical to the N-bit output of the LFSR 202 except that the N−1 value of the output of the LFSR 202 has been changed from a '0' to a '1'), and LFSR 202 output values from 96 to 127 are sent to the signal generator 204 unchanged by the spectral shaping component 702 (e.g., the N-bit timebase control word 704 is identical to the N-bit output of the LFSR 202).

Figure 7B:
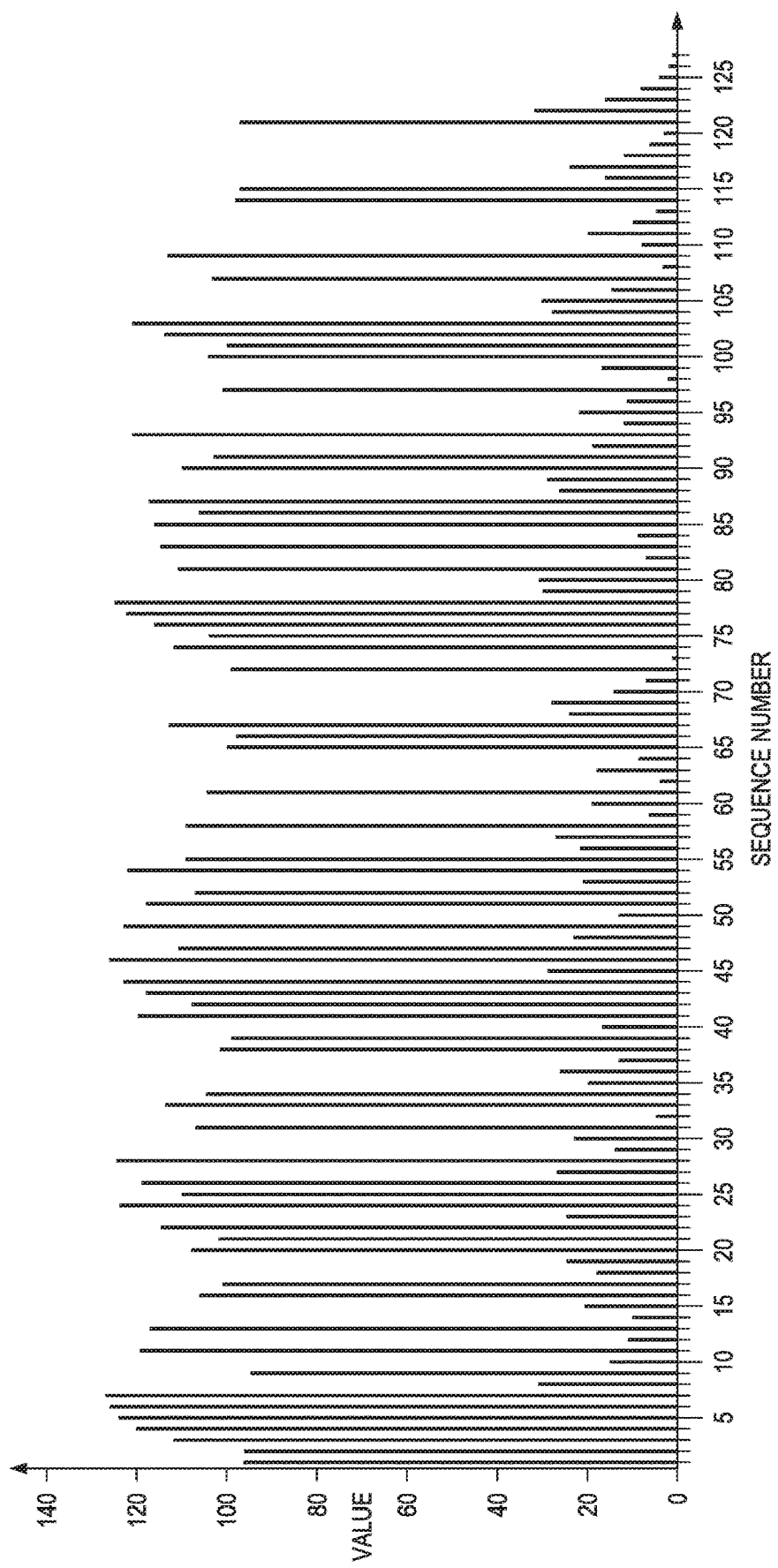
FIG. 7B shows a sequence of pseudo-random numbers generated by post-processing the outputs of a linear feedback shift register (LFSR) by a spectral shaping component in accordance with various examples.

FIG. 7B illustrates a sequence of timebase control word 704 values which have been processed by the spectral shaping component 702 to exclude values in the range of 32 to 63 by shifting the values down in value by 32 and processed by the spectral shaping component 702 to exclude values in the range of 64 to 95 by shifting the values up in value by 32. The spectral shaping component 702 sends this sequence of values to the signal generator 204 for generating the timebase signal.

In different examples, different spectral shaping operations are performed by the spectral shaping component 702. In an example, the mid-range is less than half the values of the range of values output by the LFSR 202, for example the mid-range is from 48 to 79. In an example, the mid-range is more than half the values of the range of values output by the LFSR 202, for example the mid-range is from 22 to 105. In an example, the magnitude of the change in value of the mid-range values is greater than 32. In an example, the magnitude of the change in value of the mid-range values is less than 32. In examples, a predefined fraction of the mid-range values are altered, for example 1 of 2 of the mid-range values is altered, or for example 3 of 4 of the mid-range values are altered. In examples, the spectral shaping component 702 is configured to support different spectral shaping operations, for example based on selection control inputs to the spectral shaping component 702. In an example, the spectral shaping component 702 is implemented with combinatorial logic that consumes a small footprint on the switch mode DC-to-DC converter integrated circuit 100. Alternatively, in an example, the spectral shaping component 702 is implemented as software or firmware executing on a processor in the switch mode DC-to-DC converter integrated circuit 100.

Figure 7C:
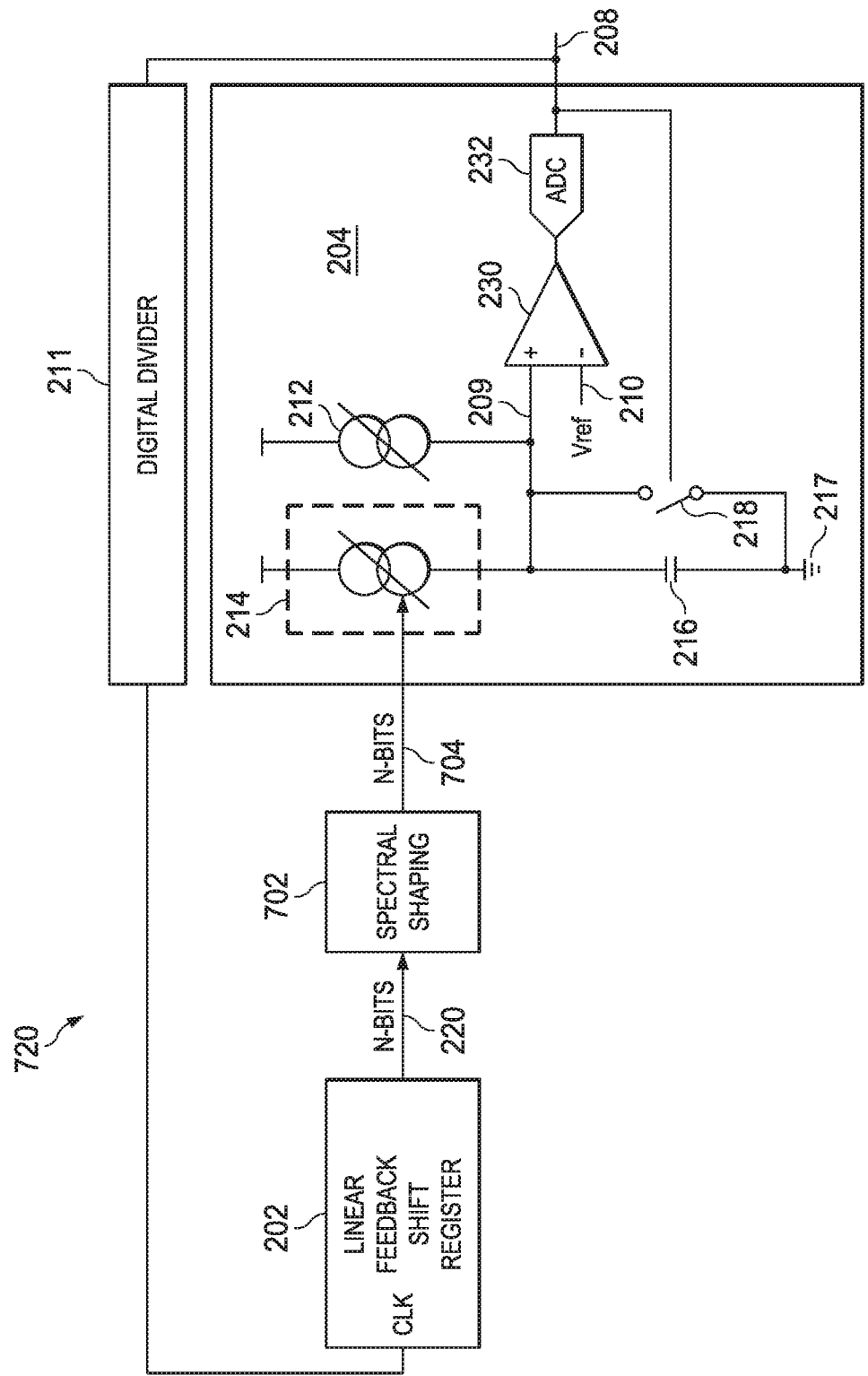
FIG. 7C shows another timebase generator including a spectral shaping component in accordance with various examples.

FIG. 7C shows another illustrative timebase generator 720 that is an alternative example to the timebase generator 700 described above with reference to FIG. 7A. The timebase generator 720 is substantially similar to the timebase generator 700 described above, with the difference that the clock signal 208 is produced by the combination of a differential amplifier 230 and an analog-to-digital converter (ADC) 232. The differential amplifier 230 is coupled to the first lead of the capacitor 216 on its first input 209 and is coupled to a voltage reference at its second input 210. The differential amplifier 230 outputs an analog signal that is based on its first and second inputs to the ADC 232, and the ADC 232 produces the clock signal 208 that feeds back into the LFSR 202 and to the switch 218.

Figure 7D:
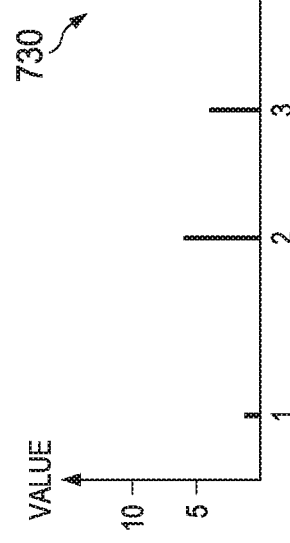
FIG. 7D shows a sequence of timebase control words in accordance with an example.
Figure 7E:
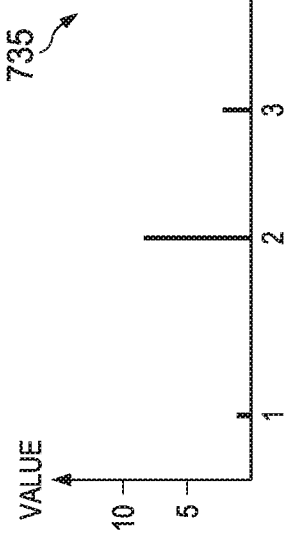
FIG. 7E shows a sequence of spectrally shaped timebase control words in accordance with an example.
Figure 7F:
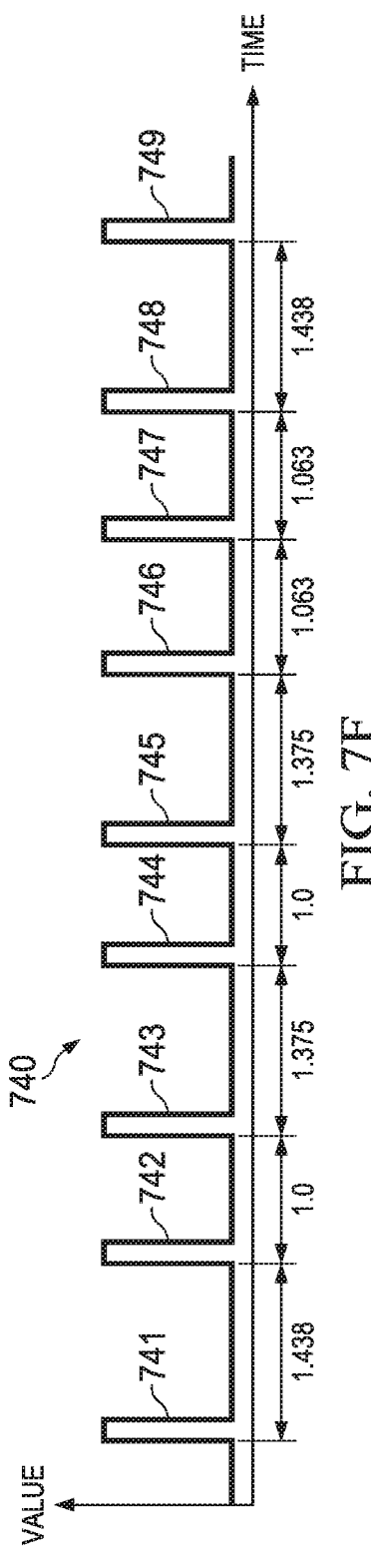
FIG. 7F shows a timebase in accordance with an example.

FIG. 7D, FIG. 7E, and FIG. 7F present a simplified illustration of the spectral shaping technique described above. The spectral shaping example described with reference to FIG. 7D, FIG. 7E, and FIG. 7F is significantly simplified to make illustrating the scenario tractable, for example by using a reduced range of example values of the timebase control word 704 and by increasing the scale of the variation in the timebase periods resulting from the timebase control word 704. The duration of the timebase signal varies by +1-22% which is larger than desirable for an actual switch mode DC-to-DC converter IC 100, but this exaggeration makes illustration of these differences more noticeable.

In FIG. 7D, a pseudo-random sequence of values 730 is illustrated. While for purposes of this scenario, these eight values have been selected manually, they can be considered to be produced by a source of pseudo-random numbers, such as from the LFSR 202. The sequence is 1, 6, 4, 8, 2, 7, 5, 3. Each value in the range 1 through 8 appears once. The middle range values of this sequence are to be altered by post-processing to exclude the mid-range values of 3, 4, 5, and 6, shifting the lower value mid-range values down and shifting the upper value mid-range values up. In FIG. 7F, the sequence of values 730 of FIG. 7E has been post processed (manually in this case) to generate a sequence of values 735 that excludes mid-range values. The sequence of values 735 illustrated in FIG. 7F is 1, 8, 2, 8, 2, 7, 7, 1. Thus, the original value 1 is left unchanged. The original value 6 is shifted up to 8, excluding that mid-range value from the sequence. The original value 4 is shifted down to 2, excluding that mid-range value from the sequence. The original value 8 is left unchanged. The original value 2 is left unchanged. The original value 7 is left unchanged. The original value 5 is shifted up to 7, excluding that mid-range value from the sequence. The original value 3 is shifted down to 1, excluding that mid-range value from the sequence. The post-processing that has been accomplished manually in creating this example is akin to the post-processing provided by the spectral shaping component 702 described above with reference to FIG. 7A and FIG. 7C. The sequence of values 735 represents the sequence of values of the timebase control word 704 in this simplified example.

In FIG. 7F, the post-processed sequence 1, 8, 2, 8, 2, 7, 7, 1 (sequence of values 735) is used to manually modulate a timebase 740 which is here represented as the rising edge of a pulse train. The pulse train comprises a first pulse 741, a second pulse 742, a third pulse 743, a fourth pulse 744, a fifth pulse 745, a sixth pulse 746, a seventh pulse 747, an eighth pulse 748, and a ninth pulse 749. The horizontal axis is time. The first timebase value corresponding to the sequence value 1 is 1.438 time units (specific time units are irrelevant in this example, but units could be in, e.g., microseconds). The second timebase value corresponding to the sequence value of 8 is 1.0 time units. The third timebase value corresponding to the sequence value of 2 is 1.375 time units. The fourth timebase value corresponding to the sequence value of 8 is 1.0 time units. The fifth timebase value corresponding to the sequence value of 2 is 1.375 time units. The sixth timebase value corresponding to the sequence value of 7 is 1.063 time units. The seventh timebase value corresponding to the sequence value of 7 is 1.063 time units. The eighth timebase value corresponding to the sequence value of 1 is 1.438 time units. The generation of the timebase 740 that has been accomplished manually in creating this example can be imagined to be produced by the signal generator 204 in response to the sequence of timebase control word 704 having the sequence of values 735 illustrated in FIG. 7E.

Figure 8:
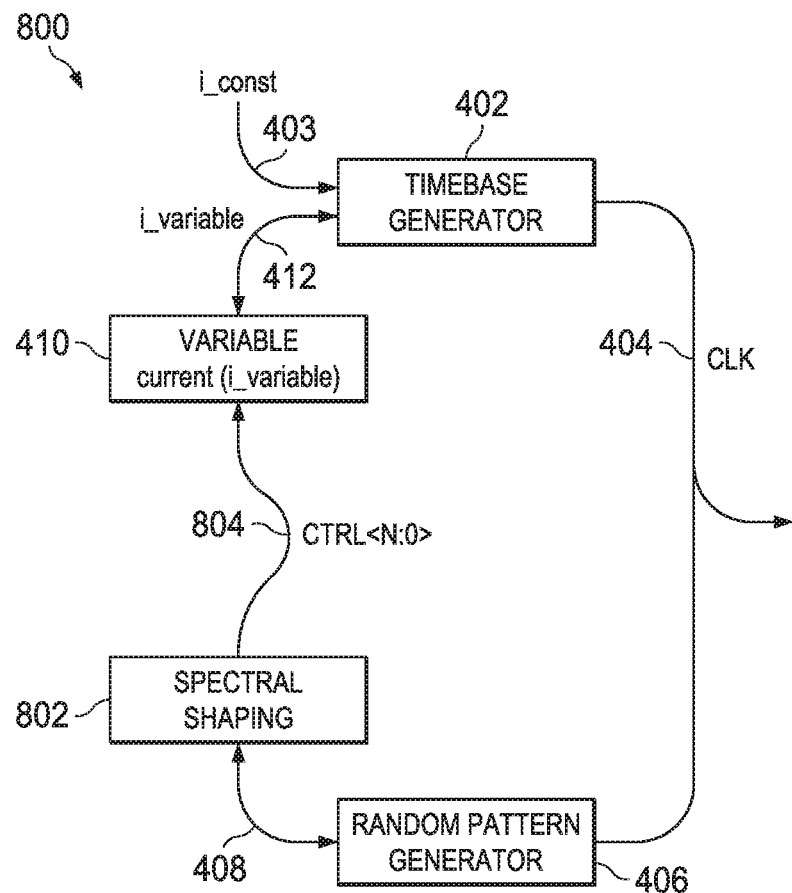
FIG. 8 shows a timebase generator processing method including spectral shaping in accordance with various examples.

FIG. 8 is a flowchart of an illustrative process 800 of generating the clock output or the switching signal of the timebase generator 700 of FIG. 7A or of timebase generator 720 of FIG. 7C. The process 800 continuously repeats while operating the timebase generator 102, 700, 720 and while operating the switch mode DC-to-DC converter 100. At block 402, a timebase generator determines a clock period as a function of a constant current 403 and of a variable current 412, such as those produced by current sources 212, 214 in FIG. 2A. This clock period controls a clock 404 that has a frequency equal to the reciprocal of the period determined at block 402. The clock period is changing on each cycle through the loop of the process 400. In an example, the clock switches from low to high and back to low only one time during each cycle through the loop of the process 400.

The clock 404 controls a random pattern generator at block 406 to set a control value 408 to a newly calculated control value, in response to the clock 404. In an example, the random pattern generator is a LFSR. In an example, the random pattern generator is a Fibonacci LFSR. In an example, the random pattern generator is one of a 7-bit Fibonacci LFSR, a 9-bit Fibonacci LFSR, an 11-bit Fibonacci LFSR, a 15-bit Fibonacci LFSR, or a 17-bit Fibonacci LFSR. In an example, the random pattern generator is a Galois LFSR. In an example, the LFSR is configured to generate a maximum length sequence of pseudo-random values, none of which repeats during the maximum length cycle. At the end of the sequence of values, the sequence starts a new cycle, starting from the initial value of the sequence. Any initial seed value can be established for the LFSR, excepting a 0 value (b00 . . . 0). In another example, the random pattern generator is a different component or circuit from the LFSR, for example a different digital pseudo-random number generator component.

The control value 408 is spectrally shaped at block 802. In some cases the spectral shaping leaves the control value 408 unchanged. In some cases the spectral shaping decreases the control value 408. In some cases the spectral shaping increases the control value 408. The spectral shaping block outputs a spectrally shaped control value 804 (e.g., N-bit timebase control word 704) that controls the variable current 412, where, in at least some examples, the amplitude of the variable current is a linear function of the spectrally shaped control value 804. As the clock 404 pulses high and back low, the LFSR shifts values through its registers and sets a different value, and the different value establishes a different variable current, and the different variable current changes the clock period in the next cycle through the loop of the process 400.

Figure 9:
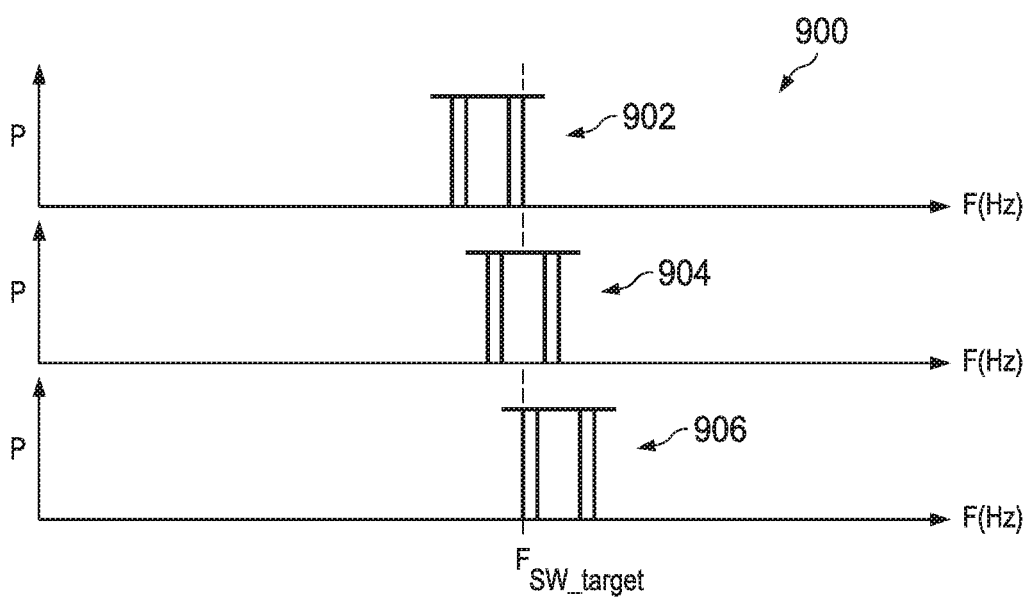
FIG. 9 shows spectrally shaped adaptations of varying switching frequency in accordance with various examples.

FIG. 9 shows the frequency bandwidth of the switching signal varying from a minimum frequency to a maximum frequency where mid-range switching frequencies are excluded, where the maximum frequency in the first multiple traces 902 is the target switching frequency. In a second multiple traces 904 the switching signal varies from a minimum frequency to a maximum frequency, where the target switching frequency is in about the middle of the varying switching signal frequency bandwidth. In a third multiple traces 906, the switching signal varies from a minimum frequency that is the target switching frequency to a maximum frequency.

The different multiple traces 902, 904, 906 can be established by varying the fixed current output of the constant current source 212 in FIG. 7A or FIG. 7C. In the first multiple traces 902, the constant current source is set to the level of the lowest frequency. In the third multiple traces 906, the constant current source is set to the level associated with the target switching frequency. In the second multiple traces 904, the constant current source is set to a level between the levels of the first multiple traces 902 and the third multiple traces 906. The structure of the timebase generator 800, 802 is flexible and can be adapted by designers to achieve different switching frequencies and different switching frequency bandwidths (the range of variation of switching signal frequency). In examples the timebase generator 800, 802 supports different spectral shaping regimes such as spectral shaping regimes that supports reduced numbers of switching frequencies in the mid-range of switching frequencies but does not exclude all switching frequencies from the mid-range of switching frequencies.

Figure 10:
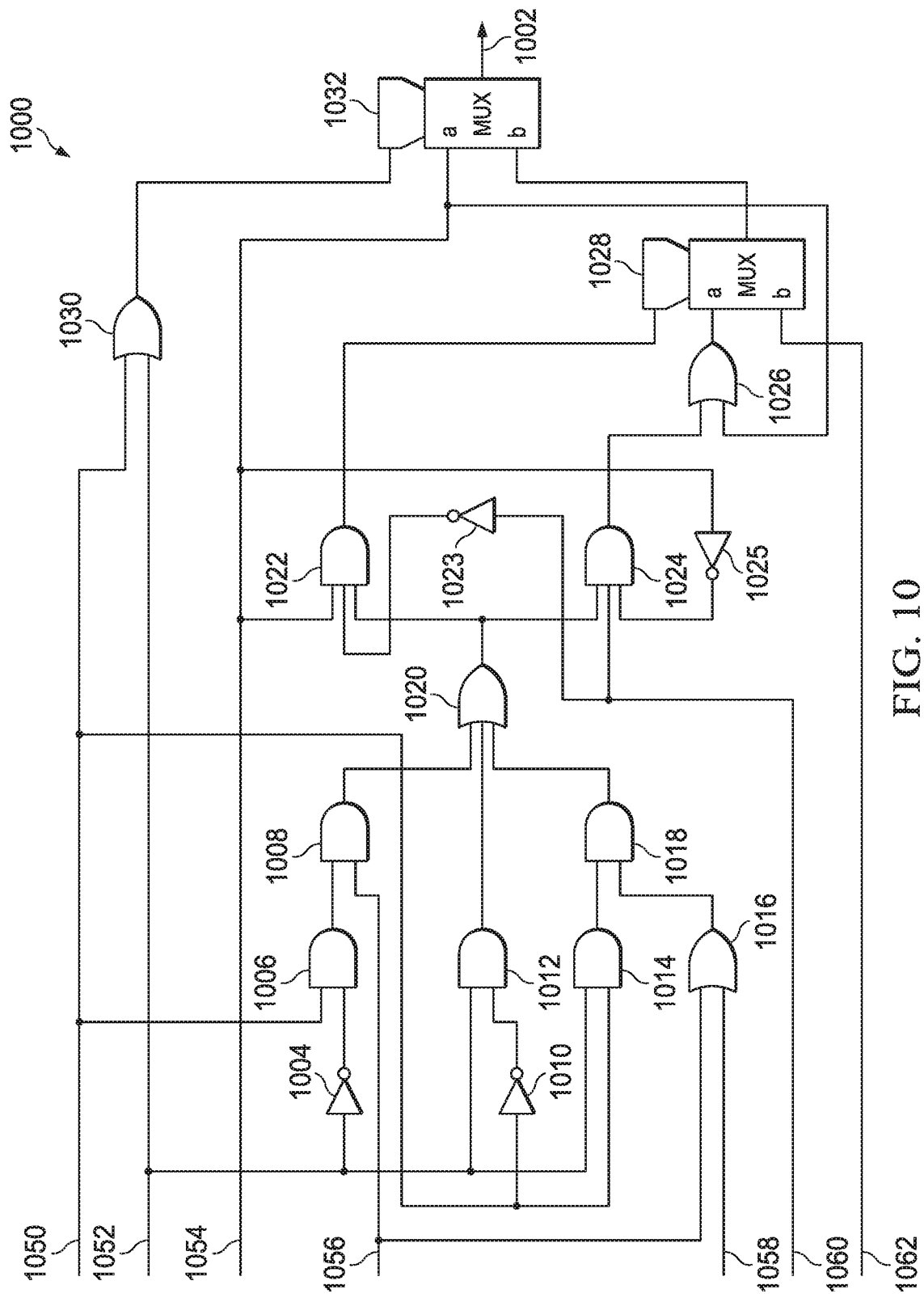
FIG. 10 is a logic diagram of linear feedback shift register output post-processing spectral shaping combinatorial logic in accordance with various examples.

FIG. 10 shows an example of spectral shaping combinational logic 1000. In an example, the spectral shaping component 702 of the timebase generator 700, 720 is implemented with a logic circuit, for example a logic circuit implementing the spectral shaping combinational logic 1000. A variety of combinational logic implementations are consistent with the switching frequency spectral shaping disclosed and taught herein. While the example spectral shaping combinational logic 1000 is directed to a 7-bit timebase control word, one skilled in the art will readily adopt the spectral shaping combinational logic 1000 to switch mode DC-to-DC converter integrated circuits 100 based on LFSRs having a different number of shift registers (e.g., 9-bit LFSRs, 11-bit LFSRs, 15-bit LFSRs, 17-bit LFSRs, etc.) or based on a different bit-length timebase control word.

The inputs to the spectral shaping combinational logic 1000 comprise a shape_spectrum_true_bit1 input 1050, a shape_spectrum_true_bit2 input 1052, an LFSR_Output_bit6 1054, an LFSR_Output_bit1 1056, an LFSR_Output_bit2 1058, an LFSR_Output_bit7 1060, and a logic low input 1062. In an example, the shape_spectrum_true_bit1 input 1050 and shape_spectrum_true_bit2 input 1052 are control inputs that are coupled to input pins of the switch mode DC-to-DC converter integrated circuit 100. In some contexts, the shape_spectrum_true_bit1 input 1050 is referred to as a first spectral shaping control input and the shape_spectrum_true_bit2 input 1052 is referred to as a second spectral shaping control input. The LFSR_Output_bit1 is coupled to a bit 1 output of the LFSR 202, the LFSR_Output_bit2 is coupled to a bit 2 output of the LFSR 202, the LFSR_Output_bit6 is coupled to a bit 6 output of the LFSR 202, and the LFSR_output_bit7 is coupled to a bit 7 output of the LFSR 202. The logic low input 1062 is coupled to a low logic voltage level, for example to a ground, in the switch mode DC-to-DC converter integrated circuit 100.

The example spectral shaping combinational logic 1000 is configured to be selected to provide no switching frequency spectral shaping (e.g., when shape_spectrum_true_bit1 input 1050 and shape_spectrum_true_bit2 input 1052 both have logic low values); to provide switching frequency spectral shaping every second switching frequency in the mid-range of switching frequencies (e.g., when shape_spectrum_true_bit1 input 1050 has a logic high value and shape_spectrum_true_bit2 input 1052 has a logic low value); to provide switching frequency spectral shaping for all switching frequencies in the mid-range of switching frequencies (e.g., when shape_spectrum_true_bit1 input 1050 has a logic low value and shape_spectrum_true_bit2 input 1052 has a logic high value); and to provide switching frequency spectral shaping for 3 of 4 switching frequencies in the mid-range of switching frequencies (e.g., when shape_spectrum_true_bit1 input 1050 and shape_spectrum_true_bit2 input 1052 both have logic high values).

The spectral shaping combinational logic 1000 comprises a first logic inverter 1004, a second logic inverter 1010, a third logic inverter 1023, and a fourth logic inverter 1025. The spectral shaping combinational logic 1000 comprises a first AND logic gate 1006, a second AND logic gate 1008, a third AND logic gate 1012, a fourth AND logic gate 1014, a fifth AND logic gate 1018, a sixth AND logic gate 1022, and a seventh AND logic gate 1024. The spectral shaping combinational logic 1000 comprises a first OR logic gate 1016, a second OR logic gate 1020, a third OR logic gate 1026, and a fourth OR logic gate 1030. The spectral shaping combinational logic 1000 comprises a first multiplexer 1032 and a second multiplexer 1028.

The shape_spectrum_true_bit1 input 1050 and shape_spectrum_true_bit2 input 1052 are coupled to the inputs of the fourth OR logic gate 1030. The output of the fourth OR logic gate 1030 is coupled to the selector input of the first multiplexer 1032. If both the inputs 1050, 1052 are logic low, the output of the fifth OR logic gate 1030 is logic low and causes the first multiplexer 1032 to couple its a-input to an output 1002 of the spectral shaping combinational logic 1000. In an example, the output 1002 of the spectral shaping combinational logic 1000 provides the sixth bit of the timebase control word input (N-bit timebase control word 704) to the signal generator 204 while bit 1 through bit 5 and bit 7 of the output of the LFSR 202 are coupled to the corresponding bits of the timebase control word input to the signal generator 204. The a-input of the first multiplexer 1032 is coupled to the LFSR_Output_bit6 1054 which is coupled to the sixth bit of the output of the LFSR 202 (e.g., the output of the sixth register of the LFSR 202). Thus, when no spectral shaping is selected (inputs 1050, 1052 are both logic low), the output 1002 of the spectral shaping combinational logic 1000 passes through bit 6 of the output of the LFSR 202 unchanged (e.g., unshaped). If either of the inputs 1050, 1052 is logic high, the output of the fifth OR logic gate 1030 is logic high and causes the first multiplexer to couple its b-input to the output 1002 of the spectral shaping combinational logic 1000. When spectral shaping of bit 6 of the timebase control word input to the signal generator 204 is performed, the shaped value is coupled from the b-input of the first multiplexer to the output 1002 of the spectral shaping combinational logic 1000.

With reference to the spectral shaping combinational logic 1000, spectral shaping of the timebase control word that controls the signal generator 204 is performed on timebase control words output by the LFSR 202 having mid-range values (value in the range 32 to 95) and affect only bit 6 of the timebase control word. When bit 6 of the timebase control word is logic high, setting it to logic low reduces the value of the 7-bit timebase control word by a value of 32. When bit 6 of the timebase control word is logic low, setting it to logic high increases the value of the 7-bit timebase control word by a value of 32. When bit 7 of the timebase control word is logic low and bit 6 of the timebase control word is logic high, the 7-bit timebase control word has a value in the range from 32 to 63, and setting bit 6 of the timebase control word to logic low decreases the value of the 7-bit timebase control word to the range 0 to 31. When bit 7 of the timebase control word is logic high and bit 6 of the timebase control word is logic low, the 7-bit timebase control word has a value in the range from 64 to 95, and setting bit 6 of the timebase control word to logic high increases the value of the 7-bit timebase control word to the range 96 to 127.

The shape_spectrum_true_bit1 input 1050 is coupled to an input of the second logic inverter 1010. The shape_spectrum_true_bit2 input 1052 and an output of the second logic inverter 1010 are coupled to the inputs of the third AND logic gate 1012. When shape_spectrum_true_bit2 input 1052 is logic high and shape_spectrum_true_bit1 is logic low, the output of the third AND logic gate 1012 is logic high. An output of the third AND logic gate 1012 is coupled to an input of the second OR logic gate 1020. When the output of the third AND logic gate 1012 is logic high, an output of the second OR logic gate 1020 is logic high.

The LFSR_Output_bit7 1060 is coupled to an input of the third logic inverter 1023. When the LFSR_Output_bit7 1060 is logic low, an output of the third logic inverter 1023 is logic high. The output of the third logic inverter 1023 is coupled to a first input of the sixth AND logic gate 1022. The LFSR_Output_bit6 1054 is coupled to a second input of the sixth AND logic gate 1022, and the output of the second OR logic gate 1020 is coupled to a third input of the sixth AND logic gate 1022. An output of the sixth AND logic gate 1022 is coupled to the selector input of the second multiplexer 1028. When the selector input of the second multiplexer 1028 is logic high, the b-input of the second multiplexer 1028 is coupled to an output of the second multiplexer 1028. The output of the second multiplexer 1028 is coupled to the b-input of the first multiplexer 1032. The logic low input 1062 is coupled to the b-input of the second multiplexer 1028. When shape_spectrum_true_bit2 input 1052 is logic high, shape_spectrum_true_bit1 is logic low, LFSR_Output_bit7 1060 is logic low, and LFSR_Output_bit6 is logic high (e.g., the 7-bit timebase control word is in the range of values 32 to 63), the second multiplexer 1028 couples its b-input to its output, the logic low input 1062 is passed through the second multiplexer 1028, through the first multiplexer 1032, and to the output 1002 of the spectral shaping combinational logic 1000 to drive bit 6 of the 7-bit timebase control word to logic low, thereby reducing the value of the 7-bit timebase control word by 32.

The LFSR_Output_bit6 1054 is coupled to an input of a fourth logic inverter 1025, and an output of the fourth logic inverter 1025 is coupled to the first input of the seventh AND logic gate 1024. The LFSR_Output_bit7 1060 is coupled to a second input of the seventh AND logic gate 1024. The output of the second OR logic gate 1020 is coupled to a third input of the seventh AND logic gate 1024. An output of the seventh AND logic gate 1024 is coupled to an input of the third OR logic gate 1026. The LFSR_Output_bit6 is also coupled to an input of the third OR logic gate 1026.

When shape_spectrum_true_bit2 input 1052 is logic high, shape_spectrum_true_bit1 is logic low, LFSR_Output_bit7 1060 is logic high, and LFSR_Output_bit6 is logic low (e.g., the 7-bit timebase control word is in the range of values 64 to 95), the a-input of the second multiplexer 1028 is coupled to its output, an output of the seventh AND logic gate 1024 is logic high, the output of the third OR logic gate 1026 is logic high, and a logic high is passed through the second multiplexer 1028, through the first multiplexer 1032, and to the output 1002 of the spectral shaping combinational logic 1000 to drive bit 6 of the 7-bit timebase control word to logic high, thereby increasing the value of the 7-bit timebase control word by 32.

When shape_spectrum_true_bit2 input 1052 is logic high, shape_spectrum_true_bit1 is logic low, LFSR_Output_bit7 1060 is logic low, and LFSR_Output_bit6 is logic low (e.g., the 7-bit timebase control word is in the range of values 1 to 32 [recall b0000000 is an excluded value in some examples]), the output of the sixth AND logic gate 1022 is logic low, the a-input of the second multiplexer 1028 is coupled to its output, the output of the seventh AND logic gate 1024 is logic low, and the output of the third OR logic gate is the value of the LFSR_Output_bit6 1054. This value of the LFSR_Output_bit6 1054 is passed to the b-input of the first multiplexer 1023 and output on the output 1002 of the spectral shaping combinational logic 1000, thereby leaving the 7-bit timebase control word unchanged.

When shape_spectrum_true_bit2 input 1052 is logic high, shape_spectrum_true_bit1 is logic low, LFSR_Output_bit7 1060 is logic high, and LFSR_Output_bit6 is logic high (e.g., the 7-bit timebase control word is in the range of values 96 to 127), the output of the sixth AND logic gate 1022 is logic low, the a-input of the second multiplexer 1028 is coupled to its output, the output of the seventh AND logic gate 1024 is logic low, and the output of the third OR logic gate is the value of the LFSR_Output_bit6 1054. This value of the LFSR_Output_bit6 1054 is passed to the b-input of the first multiplexer 1023 and output on the output 1002 of the spectral shaping combinational logic 1000, thereby leaving the 7-bit timebase control word unchanged.

The processing described above for the various ranges of values of LFSR_Output_bit6 and LFSR_Output_bit7 is performed when the output of the second OR gate 1020 is logic high. When the output of the OR gate 1020 is logic low, the LFSR_Output_bit6 value is passed through to the output 1002 (either via the a-input of the first multiplexer 1032 or via the a-input of the second multiplexer 1028 coupled through the b-input of the first multiplexer 1032).

The shape_spectrum_true_bit2 input 1052 is coupled to an input of the first logic inverter 1004. An output of the first logic inverter 1004 is coupled to a first input of the first AND logic gate 1006. The shape_spectrum_true_bit1 input 1050 is coupled to a first input of the first AND logic gate 1006. An output of the first AND logic gate 1006 is coupled to a first input of the second AND logic gate 1008. The LFSR_Output_bit1 input 1056 is coupled to a second input of the second AND logic gate 1008. When shape_spectrum_true_bit2 input 1052 is logic low, shape_spectrum_true_bit1 is logic high, and LFSR_Output_bit1 1056 is logic high (e.g., every other value of the 7-bit output of the LFSR 202 has the least significant bit (LSB)—LFSR_Output_bit1 1056—set to logic high), the output of the second AND logic gate 1008 is logic high, the output of the second OR logic gate 1020 is logic high, and the processing described above occurs. When shape_spectrum_true_bit2 input 1052 is logic low, shape_spectrum_true_bit1 is logic high, and LFSR_Output_bit1 1056 is logic low (alternating every other value of the 7-bit output of the LFSR 202), the output of the second AND logic gate 1008 is logic low, and the value of LFSR_Output_bit6 passes through third OR logic gate 1026 to the b-input of the second multiplexer 1028 to the b-input of the first multiplexer 1032 and through to the output 1002 of the combinational logic 1000. Thus, when shape_spectrum_true_bit2 input 1052 is logic low, shape_spectrum_true_bit1 is logic high, one out of every two switching frequencies in the range of timebase control word values 32 through 95 is provided switching frequency spectral shaping.

The shape_spectrum_true_bit2 input 1052 is coupled to a first input of the fourth AND gate 1014, and the shape_spectrum_true_bit1 input 1050 is coupled to a second input of the fourth AND logic gate 1014. An output of the fourth AND logic gate 1014 is coupled to a first input of the fifth AND logic gate 1018. The LFSR_Output_bit1 input 1056 is coupled to a first input of the first OR logic gate 1016, and the LFSR_Output_bit2 input 1058 is coupled to a second input of the first OR logic gate 1016. When either the LFSR_Output_bit1 is logic high or the LFSR_Output_bit2 is logic high, an output of the first OR logic gate 1016 is logic high. The output of the first OR logic gate 1016 is coupled to a second input of the fifth AND logic gate 1018.

When shape_spectrum_true_bit2 input 1052 is logic high, shape_spectrum_true_bit1 is logic high, and either the LFSR_Output_bit1 1056 is logic high or the LFSR_Output_bit2 1058 is logic high (e.g., three out of four values of the 7-bit output of the LFSR 202 have at least one of the two LSB—LFSR_Output_bit1 1056 and LFSR_Output_bit2 1058—set to logic high), the output of the fifth AND logic gate 1018 is logic high, the output of the second OR logic gate 1020 is logic high, and the processing described above occurs. When shape_spectrum_true_bit2 input 1052 is logic high, shape_spectrum_true_bit1 is logic high, and both LFSR_Output_bit1 1056 and LFSR_Output_bit2 1058 are logic low, the output of the second AND logic gate 1008 is logic low, and the value of LFSR_Output_bit6 passes through the third OR logic gate 1026 to the b-input of the second multiplexer 1028 to the b-input of the first multiplexer 1032 and through to the output 1002 of the combinational logic 1000. Thus, when shape_spectrum_true_bit2 input 1052 is logic high, shape_spectrum_true_bit1 is logic high, three of four of the switching frequencies in the range of timebase control word values 32 through 95 is provided switching frequency spectral shaping.

Figure 11A:
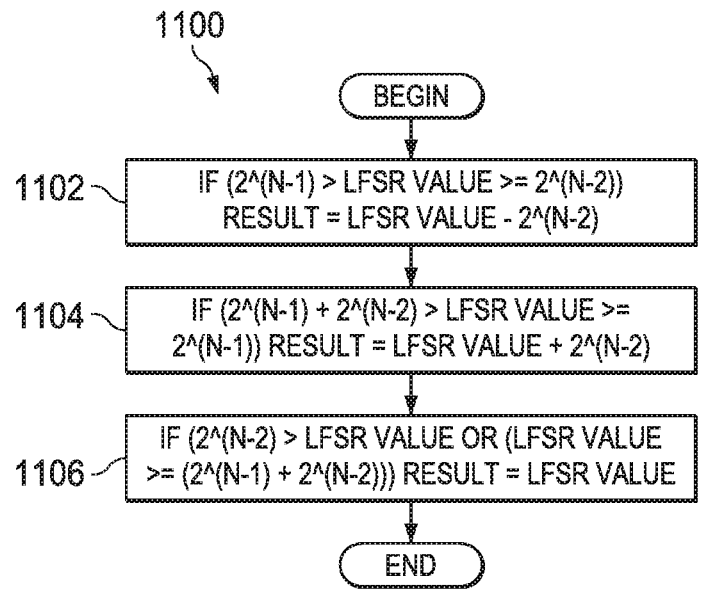
FIG. 11A is a flow chart of a method of linear feedback shift register output post-processing spectral shaping in accordance with various examples.

FIG. 11A shows a flow chart of a method 1100 for spectral shaping switching frequencies in the switch mode DC-to-DC converter integrated circuit 100. The processing of method 1100 is provided by spectral shaping component 702 described above with reference to FIG. 7A and FIG. 7C. The processing of method 1100 is provided by a spectral shaping combinational logic, for example the switching frequency spectral shaping combinational logic 1000 described above with reference to FIG. 10 or another example of switching frequency spectral shaping combinational logic.

At block 1102, if the output value of an N-bit LFSR 202 is less than $2^{(N-1)}$ and the output value of the N-bit LFSR 202 is greater than or equal to $2^{(N-2)}$, the N-bit timebase control word input to the signal generator 204 is the output value of the N-bit LFSR 202 minus $2^{(N-2)}$. If the condition of block 1102 is satisfied, the method 1100 exits. At block 1104, if the output value of the N-bit LFSR 202 is less than ($2^{(N-1)}+2^{(N-2)}$) and the output value of the N-bit LFSR 202 is greater than or equal to $2^{(N-1)}$, the N-bit timebase control word input to the signal generator 204 is the output value of the N-bit LFSR 202 plus $2^{(N-2)}$. If the condition of block 1104 is satisfied, the method 1100 exits. At block 1106, if the output value of the N-bit LFSR 202 is less than $2^{(N-2)}$ or if the output value of the N-bit LFSR 202 is greater than or equal to ($2^{(N-1)}+2^{(N-2)}$), the N-bit timebase control word input to the signal generator 204 is the output value of the N-bit LFSR 202 (e.g., the output value of the N-bit LFSR 202 is passed through to the signal generator 204 unchanged).

Figure 11B:
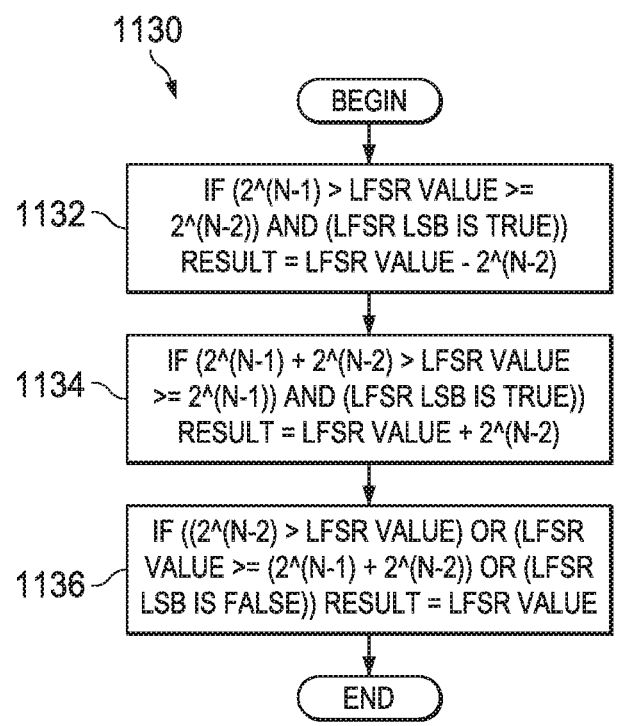
FIG. 11B is a flow chart of another method of linear feedback shift register output post-processing spectral shaping in accordance with various examples.

FIG. 11B shows a flow chart of a method 1130 for spectral shaping switching frequencies in the switch mode DC-to-DC converter integrated circuit 100. The processing of method 1130 is provided by spectral shaping component 702 described above with reference to FIG. 7A and FIG. 7C. The processing of method 1130 is provided by a spectral shaping combinational logic, for example the switching frequency spectral shaping combinational logic 1000 described above with reference to FIG. 10 or another example of switching frequency spectral shaping combinational logic.

At block 1132, if the output value of an N-bit LFSR 202 is less than $2^{(N-1)}$, the output value of the N-bit LFSR 202 is greater than or equal to $2^{(N-2)}$, and the least significant bit of the output of the N-bit LFSR 202 is logic high, the N-bit timebase control word input to the signal generator 204 is the output value of the N-bit LFSR 202 minus $2^{(N-2)}$. If the condition of block 1132 is satisfied, the method 1130 exits. At block 1134, if the output value of the N-bit LFSR 202 is less than ($2^{(N-1)}+2^{(N-2)}$), the output value of the N-bit LFSR 202 is greater than or equal to $2^{(N-1)}$, and the least significant bit of the output of the N-bit LFSR 202 is logic high, the N-bit timebase control word input to the signal generator 204 is the output value of the N-bit LFSR 202 plus $2^{(N-2)}$. If the condition of block 1134 is satisfied, the method 1130 exits. At block 1136, if the output value of the N-bit LFSR 202 is less than $2^{(N-2)}$, if the output value of the N-bit LFSR 202 is greater than or equal to ($2^{(N-1)}+2^{(N-2)}$), or if the least significant bit of the output of the N-bit LFSR 202 is logic low, the N-bit timebase control word input to the signal generator 204 is the output value of the N-bit LFSR 202 (e.g., the output value of the N-bit LFSR 202 is passed through to the signal generator 204 unchanged).

Figure 11C:
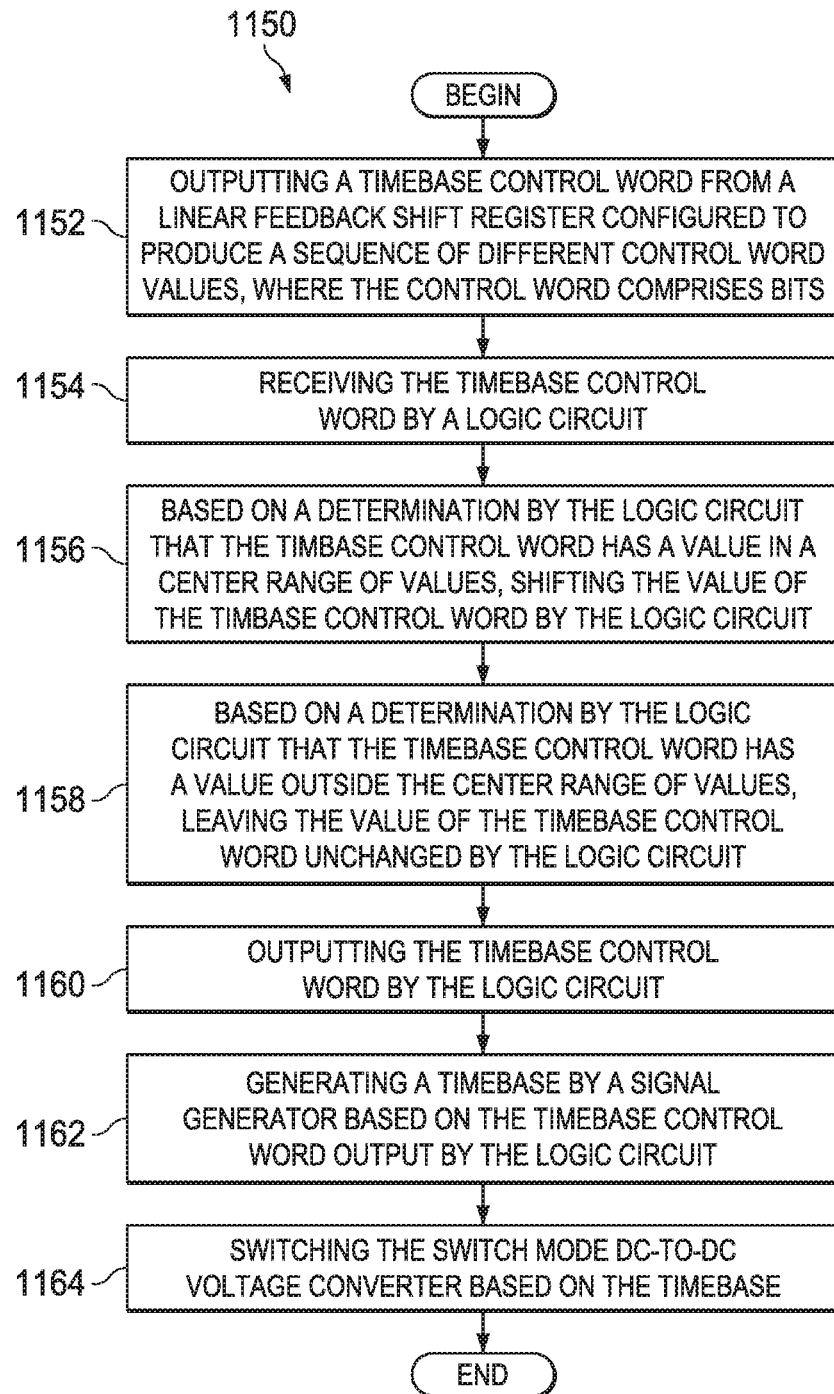
FIG. 11C is a flow chart of operating a switch mode DC-to-DC converter in accordance with various examples.

FIG. 11C shows a flowchart of a method 1150. In an example, the method 1150 is performed by a switch mode DC-to-DC converter, for example by the switch mode DC-to-DC converter IC 100. In an example, some of the processing of the method 1150 is performed by the LFSR 202, the spectral shaping component 702, and the signal generator 204 described above with reference to FIG. 2A, FIG. 2C, FIG. 3, FIG. 7A, and FIG. 7C. In an example, the processing of the spectral shaping component 702 is performed by a logic circuit that implements the combinational logic 1000 described above with reference to FIG. 10. In other examples, the processing of the spectral shaping component 702 is performed by a different logic circuit.

At block 1152, the method 1150 comprises outputting a timebase control word from a linear feedback shift register configured to produce a sequence of different timebase control word values, where the timebase control word comprises bits. At block 1154, the method 1150 comprises receiving the timebase control word by a logic circuit. At block 1156, the method 1150 comprises, based on a determination by the logic circuit that the timebase control word has a value in a center range of values, shifting the value of the timebase control word by the logic circuit. At block 1158, the method 1150 comprises, based on a determination by the logic circuit that the timebase control word has a value outside the center range of values, leaving the value of the timebase control word unchanged by the logic circuit. At block 1160, the method 1150 comprises outputting the timebase control word by the logic circuit. At block 1162, the method 1150 comprises generating a timebase by a signal generator based on the timebase control word output by the logic circuit. At block 1164, the method 1150 comprises switching the switch mode DC-to-DC converter based on the timebase.

Figure 12:
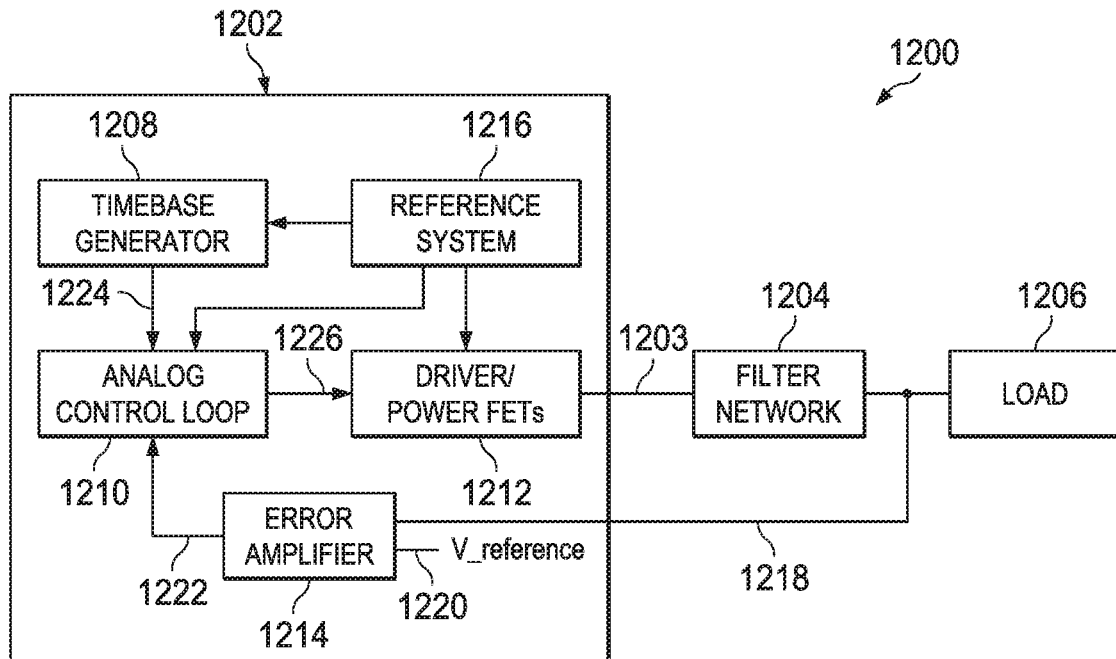
FIG. 12 shows a block diagram of a switch mode DC-to-DC converter in accordance with various examples.

FIG. 12 shows a block diagram of an illustrative system 1200. The system 1200 provides an example of how a switch DC-to-DC converter chip or integrated circuit is used in an electronic system. In an example, the system 1200 comprises a switch mode DC-to-DC converter chip 1202 outputting a DC voltage 1203 to a filter network 1204 that supplies filtered DC power to a load 1206. In an example, the system 1200 is a mobile phone, a computer in a motor vehicle, a head-unit in a motor vehicle, an electronic module in a motor vehicle, or another electronic device. In an example, the teachings of the present disclosure reduce electromagnetic interference (EMI) in these electronic systems by attenuating the switching noise through spreading the switching frequency as described herein. The system 1200 comprises other components that are not illustrated in FIG. 12. The filter network 1204 comprises inductors and capacitors to establish a filter. In an example, the load 1206 is an electronic device or an electromechanical device that relies upon stable DC voltage power. In an example, the load 1206 is a display screen of an electronic device, a microprocessor of an electronic device, a digital signal processor of an electronic device, an analog-to-digital converter (ADC), a power amplifier, a radio frequency power amplifier (RFPA), a radio transceiver of an electronic device, a vibrator motor of an electronic device, or yet other items. In an example, the DC-to-DC converter chip 1202 is embodied in an integrated circuit.

The switch mode DC-to-DC converter chip 1202 comprises a timebase generator 1208, an analog control loop 1210, a DC output driver 1212, an error amplifier 1214, and a reference system 1216. In embodiments, the switch mode DC-to-DC converter chip 1202 has more or fewer components. The voltage output by the filter network 1204 to the load 1206 is fed back into the switch mode DC-to-DC converter chip 1202 to the error amplifier 1214 as feedback 1218 to promote the switch mode DC-to-DC converter chip 1202 meeting its DC output voltage specifications. The error amplifier 1214 is configured to amplify the difference between the feedback 1218 and a voltage reference 1220. An error signal 1222 is output by the error amplifier 1214 to the analog control loop 1210 which uses this error signal 1222 to adapt its drive signal 1226 to the DC output driver 1212.

The timebase generator 1208 outputs a switching signal 1224 to the analog control loop 1210, and this switching signal 1224 and the output of the error amplifier 1214 is used to generate the desired DC voltage of the DC-to-DC converter chip 1202. In an example, the timebase generator 1208 is implemented as described above.

Figure 13:
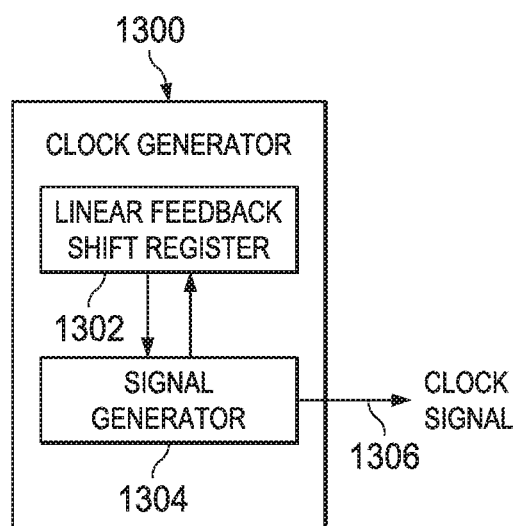
FIG. 13 shows a clock generator in accordance with various examples.

FIG. 13 shows a clock generator chip 1300 or clock generator integrated circuit. In an example, the clock generator chip 1300 provides a clock signal 1306 to electronic components in an electronic device, for example to microprocessors (MPUs), to digital signal processors (DSPs), to graphical processing units (GPUs), to field programmable gate arrays (FPGAs), to complex programmable logic devices (CPLDs), to programmable logic devices (PLDs), to application specific integrated circuits (ASICs), dynamic random access memories (DRAMs), phase locked loops (PLLs), and to other electronic devices. The aforementioned approach to spreading the spectrum of switching noise by dithering or varying the frequency of the clock is applicable to the clock generator chip 1300 as well. In an example, the clock generator chip 1300 comprises a LFSR 1302 that is coupled to a signal generator 1304. In an example, the LFSR 1302 and signal generator 1304 are implemented and operated similarly to the timebase generator 102 and 200 described above.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. In an example, the configuring may be performed by built-in software, firmware, or hardware logic providing auto adjusting and/or optimization of the operation based on the actual mode of operation of either the switch mode DC-to-DC converter chip 100 or on the load. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
   an integrated circuit, comprising:
   a timebase generator that comprises a linear feedback shift register (LFSR) configured to output a timebase control word to spread a timebase frequency, a logic circuit having an input coupled to the LFSR and configured to modify selected values of the timebase control word, and a timebase signal generator coupled to the LFSR and to the logic circuit, wherein the timebase signal generator is configured to generate a timebase of the timebase generator based on the timebase control word received from the LFSR and from the logic circuit; and
   a switch mode direct current-to-direct current (DC-to-DC) converter coupled to the timebase generator and configured to output a DC power based on the timebase generated by the timebase generator,
   wherein the logic circuit is configured to modify selected values of the timebase control word by inverting a second most significant bit of the timebase control word.

2. The system of claim 1, wherein the logic circuit is configured to modify selected values of the timebase control word by inverting the second most significant bit of the timebase control word based on a value of a most significant bit of the timebase control word and based on a value of the second most significant bit of the time base control word.

3. The system of claim 2, wherein the logic circuit is configured to modify selected values of the timebase control word by inverting the second most significant bit of the timebase control word based also on a value of a least significant bit of the timebase control word.

4. The system of claim 1, wherein the LFSR is a Fibonacci LFSR.

5. The system of claim 1, wherein the LFSR is a Galois LFSR.

6. The system of claim 1, wherein the LFSR is a seven bit LFSR.

7. A method of operating a switch mode direct current to direct current (DC-to-DC) converter, comprising:
   outputting a timebase control word from a linear feedback shift register configured to produce a sequence of different timebase control word values, wherein the timebase control word comprises bits;
   receiving the timebase control word by a logic circuit;
   based on a determination by the logic circuit that the timebase control word has a value in a center range of values, shifting the value of the timebase control word by the logic circuit;
   based on a determination by the logic circuit that the timebase control word has a value outside the center range of values, leaving the value of the timebase control word unchanged by the logic circuit;
   outputting the timebase control word by the logic circuit;
   generating a timebase by a timebase signal generator based on the timebase control word output by the logic circuit; and
   switching the switch mode DC-to-DC converter based on the timebase.

8. The method of claim 7, wherein shifting the value of the timebase control word comprises inverting a second most significant bit of the timebase control word.

9. The method of claim 7, wherein the logic circuit is configured to shift the value of the timebase control word based in part on a least significant bit of the timebase control word.

10. The method of claim 9, wherein the logic circuit is configured to shift the value of the timebase control word based in part on a second least significant bit of the timebase control word.

11. The method of claim 7, wherein the logic circuit is configured to shift the value of the timebase control word based in part on a spectral shaping control input of the logic circuit.

12. The method of claim 7, wherein the linear feedback shift register is a Fibonacci linear feedback shift register.

13. The method of claim 7, wherein the linear feedback shift register is a Galois linear feedback shift register.

* * * * *